(12) United States Patent
Toh et al.

(10) Patent No.: US 10,134,459 B2
(45) Date of Patent: Nov. 20, 2018

(54) MRAM WITH METAL-INSULATOR-TRANSITION MATERIAL

(71) Applicant: GLOBALFOUNDRIES Singapore Pte. Ltd., Singapore (SG)

(72) Inventors: Eng Huat Toh, Singapore (SG); Vinayak Bharat Naik, Singapore (SG); Chenchen Jacob Wang, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 254 days.

(21) Appl. No.: 15/012,763

(22) Filed: Feb. 1, 2016

(65) Prior Publication Data

US 2016/0225818 A1  Aug. 4, 2016

Related U.S. Application Data

(60) Provisional application No. 62/111,115, filed on Feb. 3, 2015.

(51) Int. Cl.
*G11C 11/00* (2006.01)
*G11C 11/16* (2006.01)
(Continued)

(52) U.S. Cl.
CPC .......... *G11C 11/1675* (2013.01); *G11C 11/16* (2013.01); *G11C 11/1657* (2013.01);
(Continued)

(58) Field of Classification Search
CPC ... G11C 11/161; G11C 11/1675; G11C 11/16; G11C 11/1673; G11C 11/1659; G11C 11/5607; G11C 11/1693
See application file for complete search history.

(56) References Cited

U.S. PATENT DOCUMENTS

| | | | |
|---|---|---|---|
| 8,792,266 B2 * | 7/2014 | Takashima | G11C 13/0069 365/148 |
| 2008/0308887 A1 * | 12/2008 | Asao | B82Y 10/00 257/421 |

(Continued)

OTHER PUBLICATIONS

Hai Li et al., "Nonvolatile Memory Design: Magnetic, Resistive, and Phase Change", 2011, pp. 77-78, CRC Press.

(Continued)

*Primary Examiner* — Hien Nguyen
(74) *Attorney, Agent, or Firm* — Horizon IP PTE Ltd.

(57) ABSTRACT

Memory cells and methods for forming a memory cell are disclosed. The memory cell includes a first selector having a first gate coupled to a first word line (WL) and first and second source/drain (S/D) regions, and a second selector having a second gate coupled to a second WL and first and second S/D regions. The second S/D regions of the first and the second selectors are a common S/D region. The first and the second WLs are a common WL and the second S/D regions of the first and second selectors are coupled to a source line (SL). The memory cell includes a storage element which includes a magnetic tunnel junction (MTJ) element coupled with a bit line (BL) and the first and the second selectors, and a voltage control switch which includes a metal-insulator-transition (MIT) material coupled with the first selector.

20 Claims, 28 Drawing Sheets

110a

110b

(51) Int. Cl.
*H01L 27/22* (2006.01)
*H01L 43/02* (2006.01)
*H01L 43/08* (2006.01)
*H01L 43/12* (2006.01)

(52) U.S. Cl.
CPC ...... *G11C 11/1659* (2013.01); *G11C 11/1673* (2013.01); *H01L 27/228* (2013.01); *H01L 43/02* (2013.01); *H01L 43/08* (2013.01); *H01L 43/12* (2013.01)

(56) References Cited

U.S. PATENT DOCUMENTS

| | | | |
|---|---|---|---|
| 2014/0110765 A1* | 4/2014 | Murali | H01L 21/28088 257/288 |
| 2014/0284738 A1* | 9/2014 | Nakazawa | H01L 27/228 257/421 |
| 2015/0171186 A1* | 6/2015 | Yin | H01L 29/66628 438/300 |
| 2016/0035405 A1* | 2/2016 | Kawasumi | G11C 11/1697 365/72 |

OTHER PUBLICATIONS

Jaewoo Jeong et al., "Suppression of Metal-Insulator Transition in VO2 by Electric Field-Induced Oxygen Vacancy Formation", Science, Mar. 2013, pp. 1402-1404, vol. 339, "http://www.sciencemag.org/".

* cited by examiner

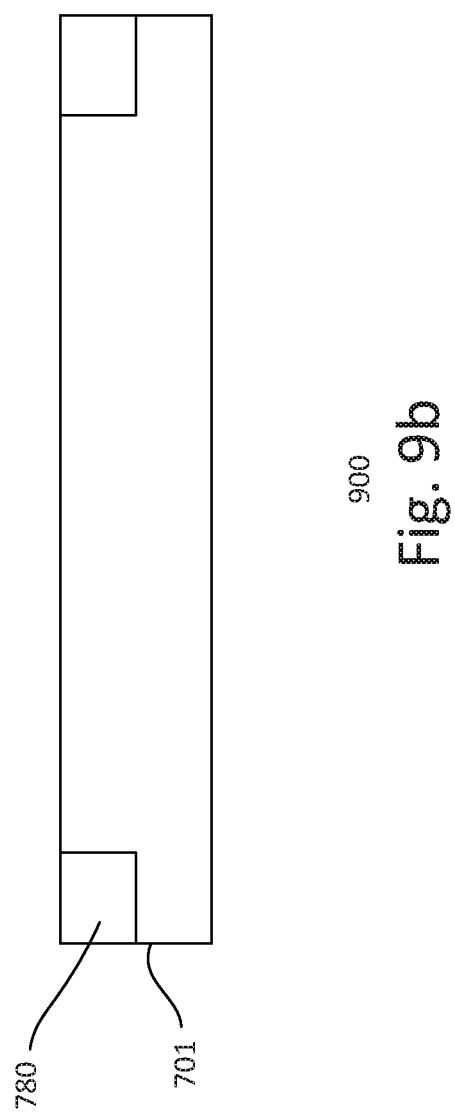

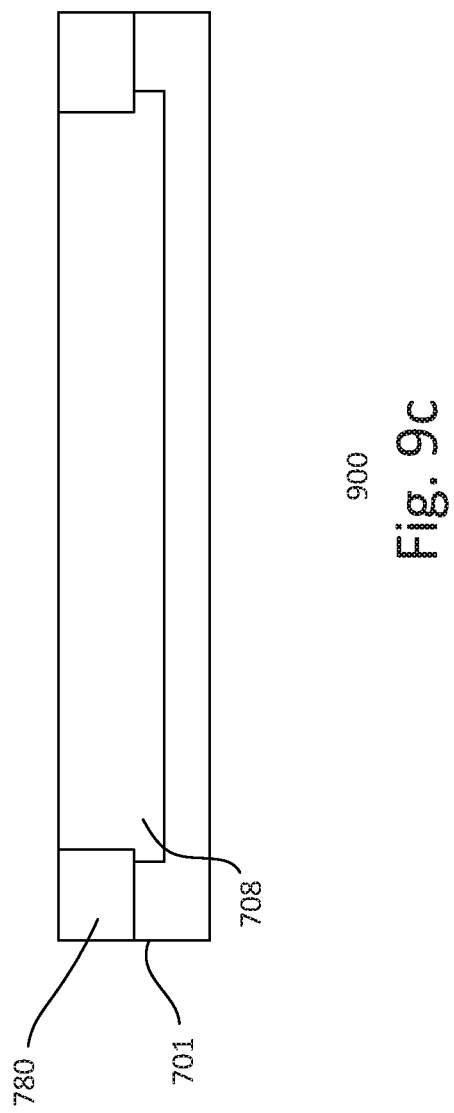

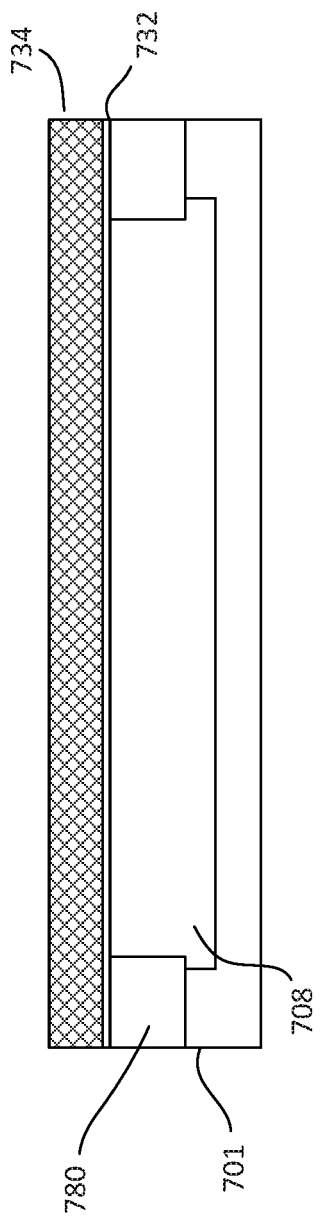

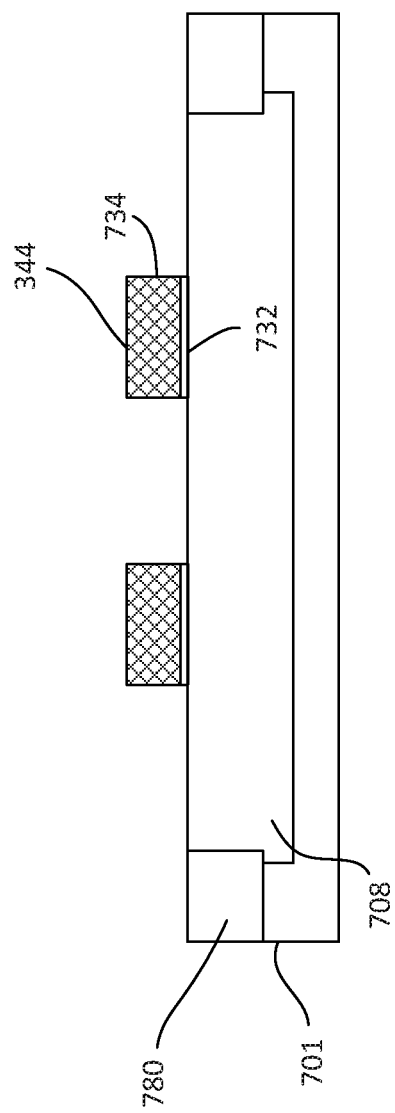

MRAM WITH METAL-INSULATOR-TRANSITION MATERIAL

CROSS-REFERENCE TO RELATED APPLICATION

This application claims the priority benefit of U.S. Provisional Application Ser. No. 62/111,115, filed on Feb. 3, 2015, which is hereby incorporated by reference in its entirety for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information.

However, conventional magnetic memory cells suffer from narrow sense margin and large distributions of anti-parallel and parallel resistance states in both transistors and MTJ characteristics, affecting the reliability of READ and WRITE operations of the memory cells in high speed applications. Various techniques have been proposed to provide reliable READ and WRITE operations for the magnetic memory cells. Nevertheless, these techniques may require complex circuitry, consume large cell area and high power consumption which are undesirable as memory devices are being shrunk further.

For reasons described above, it is desirable to develop a reliable memory cell with high sensing margin, good READ and WRITE distribution, and reduced cell area.

SUMMARY

Embodiments generally relate to memory cells and methods for forming thereof. In one embodiment, a memory cell is disclosed. The memory cell includes a first selector having a first gate coupled to a first word line (WL) and first and second source/drain (S/D) regions, and a second selector having a second gate coupled to a second WL and first and second S/D regions. The second S/D regions of the first and the second selectors are a common S/D region. The first and the second WLs are a common WL and the second S/D regions of the first and second selectors are coupled to a source line (SL). The memory cell includes a storage element which includes a magnetic tunnel junction (MTJ) element coupled with a bit line (BL) and the first and the second selectors, and a voltage control switch which includes a metal-insulator-transition (MIT) material coupled with the first selector.

In another embodiment, a method of operating a memory cell is presented. The method includes providing a memory cell. The memory cell includes a first selector having a first gate coupled to a first word line (WL) and first and second source/drain (S/D) regions, and a second selector having a second gate coupled to a second WL and first and second S/D regions. The second S/D regions of the first and the second selectors are a common S/D region. The first and the second WLs are a common WL and the second S/D regions of the first and second selectors are coupled to a source line (SL). The memory cell includes a storage element which includes a magnetic tunnel junction (MTJ) element coupled with a bit line (BL) and the first and the second selectors, and a voltage control switch which includes a metal-insulator-transition (MIT) material coupled with the first selector. A read operation or write operation is performed with the memory cell. When a write operation is performed or high voltage is applied to the common WL, the MIT material is in conductive state and the first selector is turned ON. When a read operation is performed or low voltage is applied to the common WL, the MIT material is in insulating state and the first selector is turned OFF while the WL conducts appropriate current to the second selector such that the second selector is turned ON.

In yet another embodiment, a method of forming a memory cell is presented. The method includes providing a substrate defined with a memory cell region. A first selector is formed on the substrate. The first selector includes a first gate and first and second source/drain (S/D) regions. A second selector is formed on the substrate. The second selector includes a second gate and first and second S/D regions. The second S/D regions of the first and second selectors are a common second S/D region and the first and second gates are coupled to a common wordline (WL). A voltage control switch which includes a metal-insulator-transition (MIT) material is formed and is coupled with the first selector. A storage element which includes a magnetic tunnel junction (MTJ) element is formed in a storage dielectric layer over the first and second selectors. An upper metal level which includes a bit line (BL) is formed over the storage dielectric layer. The MTJ element is coupled between the BL and the common second S/D region of the first and second selectors.

These and other advantages and features of the embodiments herein disclosed will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 9a-9m show cross-sectional views of an embodiment of a process for forming a memory cell.

DETAILED DESCRIPTION

Embodiments of the present disclosure generally relate to memory cells. In one embodiment, the memory cells are magnetic resistive memory cells. Magnetic resistive memory cells include magnetic tunnel junction (MTJ) elements. Other suitable types of magnetic resistive memory cells may also be useful. The memory cells are configured to produce high sensing margin to ensure reliability of READ and WRITE operations of the memory cells. For example, the memory cells are configured to include a write selector having a voltage control switch which includes a phase transition material that can be pre-selected such that it is in a conductive state during WRITE (high voltage) operation and in an insulating state during READ (low voltage) operation. For example, the phase transition material may be disposed on the source side of the write selector or disposed on the gate region of the write selector. The memory cells can be incorporated into or used with, for example, electronic products such as mobile phones, smart cards, mass storage, enterprise storage and industrial and automotive products.

Figure 1A:
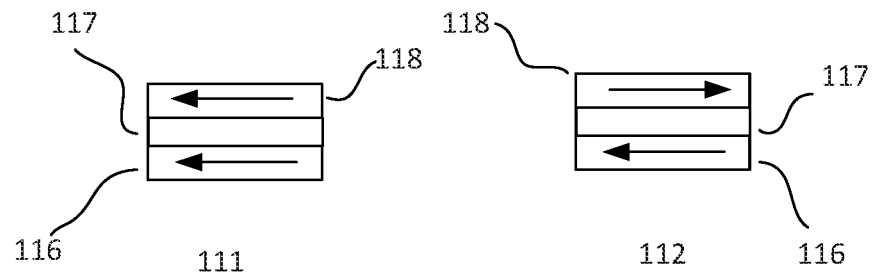
FIGS. 1a-1b show diagrams of parallel state and anti-parallel state of a MTJ element.

FIG. 1a shows a simplified cross-sectional view of an embodiment of a MTJ element 110a. As shown, the magnetization, magnetization direction, magnetization vector, or magnetic orientation of the magnetic element is in planar configuration. Planar configuration, for example, refers to the direction along or parallel to the plane containing the magnetization of a magnet. A MTJ element includes a reference magnetic layer 116, a tunneling barrier layer 117 and a free magnetic layer 118. The magnetic orientation of the reference layer is designed to be fixed while the magnetic orientation of the free layer may be programmed to be in a first or same direction as the reference layer or in a second or opposite direction as the reference layer. For example, as shown by structure 111, the magnetic direction of the free layer is programmed to be in the first or parallel direction as the reference layer. The corresponding MTJ electrical resistance between the free layer 118 and the reference layer 116 is denoted as a parallel resistance denoted by $R_P$. Structure 112 illustrates that the magnetization of the free layer is programmed to be in a second or anti-parallel direction as the reference layer. The corresponding MTJ electrical resistance between the free layer 118 and the fixed layer 116 is denoted as an antiparallel resistance denoted by $R_{AP}$. The antiparallel resistance $R_{AP}$ is higher than the parallel resistance $R_P$. Tunnel-magnetoresistance (TMR) is calculated using the formula given by $(R_{AP}-R_P)/R_P$. The TMR ratio determines the sense margin. For example, larger TMR ratio leads to larger sense margin.

Figure 1B:
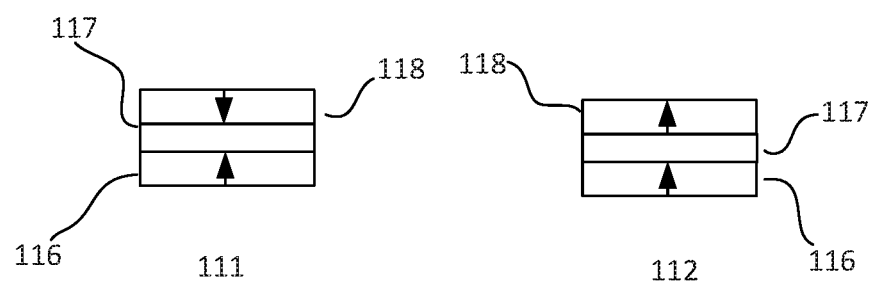

FIG. 1b shows perpendicular alignment of magnetic orientations in the magnetic layers of a MTJ element 110b. Perpendicular, for example, refers to the direction perpendicular to the plane containing the magnetization of a magnet. As shown in FIG. 1b, the MTJ element 110b includes a reference layer 116, a tunneling barrier layer 117 and a free layer 118. When MTJ element 110b is in a magnetic antiparallel state, magnetic orientations of the free layer 118 and the reference layer 116 are in opposite directions as shown by structure 111. The corresponding MTJ electrical resistance between the free layer 118 and the reference layer 116 is denoted as $R_{AP}$. When MTJ element 110b is in a magnetic parallel state, magnetic orientations of the free layer 118 and the reference layer 116 are in the same direction as shown by structure 112. The corresponding MTJ electrical resistance between the free layer 118 and the reference layer 116 is denoted as $R_P$.

Figure 2A:
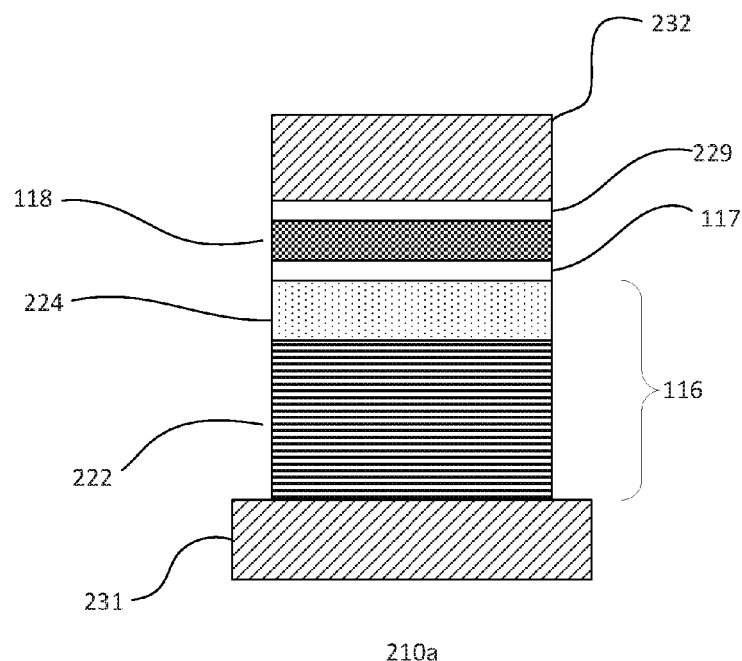
FIGS. 2a-2b show cross-sectional views of various embodiments of a MTJ element.
Figure 2B:
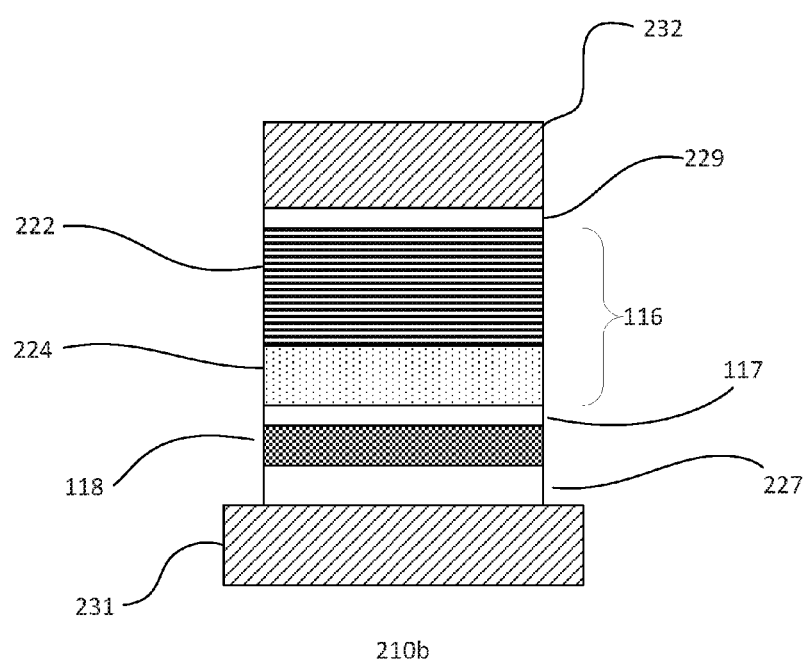

FIGS. 2a-2b show cross-sectional views of exemplary embodiments of MTJ stacks or elements. FIG. 2a shows a bottom-pinned MTJ element 210a and FIG. 2b shows a top-pinned MTJ element 210b. Top and bottom refer to position of layers relative to the substrate surface.

As shown in FIG. 2a, bottom-pinned MTJ stack 210a includes a bottom electrode 231, a reference magnetic layer 116, a tunneling barrier layer 117, a free magnetic layer 118, a cap layer 229 and a top electrode layer 232 on the cap layer 229. The reference layer 116, in one embodiment, includes a magnetic layer 224 and a pinning layer 222 on the bottom electrode 231. The pinning layer, for example, pins the magnetization direction of the corresponding magnetic layer, thereby forming a pinned layer.

As shown in FIG. 2b, top-pinned MTJ stack 210b includes a bottom electrode 231, a buffer layer 227, a free layer 118, a tunneling barrier layer 117, a reference layer 116, a cap layer 229 and a top electrode layer 232 on the cap layer 229. The reference layer 116, in one embodiment, includes a magnetic layer 224 and a pinning layer 222. The pinning layer, for example, pins the magnetization direction of the corresponding magnetic layer, thereby forming a pinned layer.

The free layer may be CoFeB, the tunneling barrier layer may be MgO or $Al_2O_3$, and the reference layer may be CoFeB/X/Ru/X, where X can be CoNi, NiFe, FePt or, PtMn or, IrMn, with CoFeB being the magnetic layer and X/Ru/X being the pinning layer. The top and bottom electrodes may be TaN or Ta and the buffer layer may be Ru. The buffer layer, for example, serves to prevent diffusion of the material of the bottom electrode into the tunneling barrier layer. Other suitable configurations or materials for the MTJ stack may also be useful.

Figure 3:
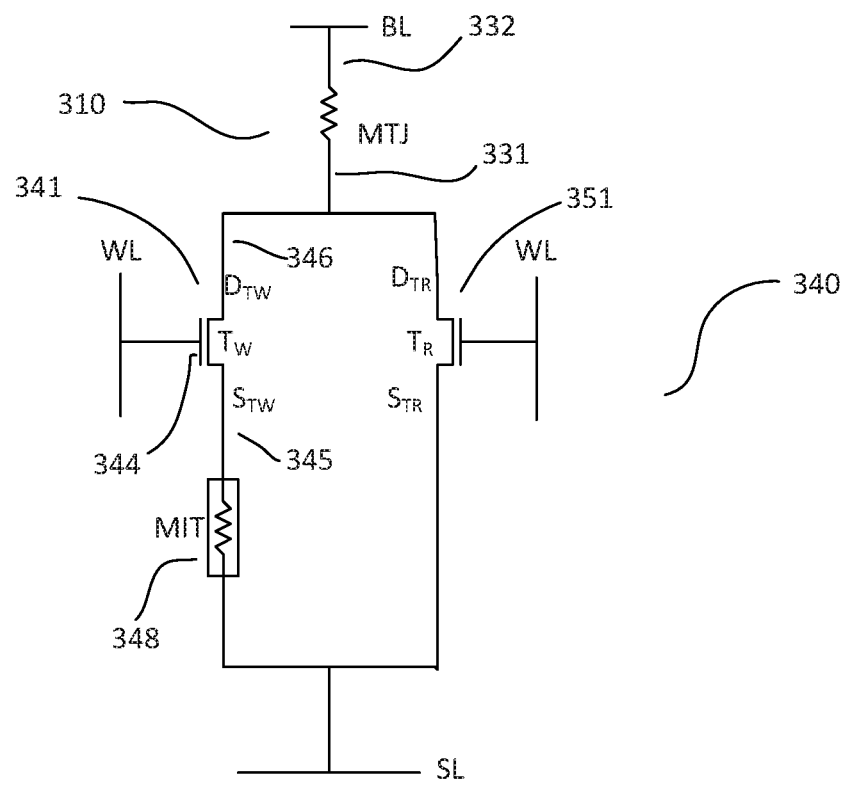
FIG. 3 shows a schematic diagram of an embodiment of a memory cell.

FIG. 3 shows a schematic diagram of an embodiment of a memory cell 300. The memory cell is a non-volatile memory cell, for example, a magnetic memory cell. In one embodiment, the memory cell is a Spin Torque Transfer-Magnetic Random Access Memory (STT-MRAM) cell. Other suitable types of memory cells may also be useful. The embodiments as described in this disclosure can also be implemented in other technologies which require separate transistors for READ and WRITE operations to tighten the sensing distribution.

The memory cell includes a storage unit 310 and a cell selector unit 340. The storage unit is coupled to the cell selector unit. The storage unit 310, in one embodiment, includes a storage element. The storage element, for example, may be a resistive storage element. In one embodiment, the storage element is a magnetic resistive memory storage element, such as a MTJ element. The MTJ element may be such as those described in FIGS. 1a-1b and 2a-2b. Other suitable types of MTJ or resistive storage element may also be useful.

The storage element includes first and second electrodes 331 and 332. The first electrode 331, for example, may be a bottom electrode while the second electrode 332 may be a top electrode. Other configurations of electrodes may also be useful. For instance, the first electrode may be a top electrode while the second electrode may be a bottom electrode. In one embodiment, the second electrode 332 of the storage element is electrically connected to a bit line BL.

Referring to FIG. 3, the cell selector unit 340 of the memory cell 300 includes first and second selector elements 341 and 351. In one embodiment, the first and second selectors are electrically connected to the first electrode 331 of the storage element. The first selector 341, for example, may be a write selector $T_W$ and the second selector 351, for example, may be a read selector $T_R$. The selectors, in one embodiment, include selector transistors, such as metal oxide semiconductor (MOS) transistors. In one embodiment, the transistors are n-type MOS transistors. Other types of transistors may also be useful. A selector transistor, as shown, includes first and second source/drain (S/D) terminals 345 and 346 and a gate or control terminal 344. The first S/D terminal may be referred to as a source terminal and the second S/D terminal may be referred to as a drain terminal. As shown, the first selector transistor $T_W$ includes first and second S/D terminals $S_{TW}$ and $D_{TW}$ and a gate or control terminal. The second selector transistor $T_R$, as shown, includes first and second S/D terminals $S_{TR}$ and $D_{TR}$ and a gate or control terminal. Other types of selectors may also be useful.

The write selector $T_W$ selectively couples a write channel or path to the storage element. The read selector $T_R$ selectively couples a read channel or path to the storage element. The first selector $T_W$ is also coupled with a first word line (WL) at the gate. The second selector $T_R$ is also coupled with a second word line (WL) at the gate. In one embodiment, the first and second word lines are a common word line. In one embodiment, the gate of the first selector $T_W$ and the gate of the second selector $T_R$ are coupled to a common WL.

The memory cell includes a voltage control switch 348. The voltage control switch is a phase transition switch. For example, the voltage control switch may be a metal-insulator-transition (MIT) material such as doped vanadium dioxide ($VO_2$). The MIT material, such as undoped or doped $VO_2$, is chosen such that it is in metallic or conductive state when subject to a high voltage and in insulating state when subject to a low voltage. By way of example, the doped $VO_2$ includes chromium or titanium-doped $VO_2$. Other suitable types of MIT material may also be useful.

In one embodiment, the memory cell 300 is a STT-MRAM with selective WRITE and READ transistors coupled to a single word line WL and configured with a MIT material at source side of the write selector and coupled to a source line SL as shown in FIG. 3. In one embodiment, the MIT material is electrically connected in series with the source terminal $S_{TW}$ of the write selector $T_W$ as shown in FIG. 3. The MIT material coupled in series with the source terminal $S_{TW}$ of write transistor $T_W$, in one embodiment, can be pre-selected such that the write selector $T_W$ will be turned ON only during WRITE (high voltage) operation and turned OFF during READ (low voltage) operation. For example, when the word line voltage is zero, both write and read selectors are OFF. When the word line voltage is low, the pre-selected MIT material is in insulating state, resulting in the write selector being turned OFF while the word line conducts appropriate current to the read selector such that the read selector is turned ON. When the word line voltage is high, the pre-selected MIT material transforms to metallic state becoming conductive and the write selector conducts electrical current. The write selector is turned ON and the read selector remains ON. Thus, the write selector is ON during WRITE (high voltage) operation and OFF during READ (low voltage) operation. Such configuration allows the write selector to be tuned for high current for WRITE operation while the read selector is tuned for READ operation with low voltage when the write selector is OFF.

The phase transition characteristic of the MIT material of the voltage control switch can be exploited by changing the voltage or the direction of the current at the terminals. The electric field-induced metallic phase, reflected in the source-drain current $I_{SD}$, is generally stable over extended periods of time. However, the insulating phase could be nearly recovered by applying reverse gate voltages similar in value to those needed to induce the metallic phase. These phase transition properties may be exploited. For example, some phase transition materials such as titanium or chromium-doped $VO_2$ may exhibit a significant increase in resistance and changes from being conductive to insulating when a critical electric field is present or a temperature is reached. Other phase transition materials such as undoped $VO_2$ may exhibit a decrease in resistance and changes from being insulating to conductive when a critical electric field is present or a temperature is reached. The electric fields and/or temperature vary as a function of the voltage applied to the various transistor terminals.

Continuing with FIG. 3, in one embodiment, the first selector element (write transistor) $T_W$ is coupled to the storage element and the voltage control switch. For example, the first terminal 331 of the storage element (MTJ) is coupled to the second terminal (drain terminal) $D_{TW}$ of write selector. The voltage control switch (MIT) is coupled in series between the source line SL and the first terminal (source terminal) $S_{TW}$ of write selector. The control or gate terminal of $T_W$ of the write selector is coupled to a word line WL.

As for the second selector element (read selector) $T_R$, it is also coupled to the first terminal 331 of the storage element (MTJ). For example, the second terminal (drain terminal) $D_{TR}$ of the read selector is coupled to the first terminal of the storage element while the first terminal (source terminal) $S_{TR}$ of the read selector is coupled to a source line SL. The read selector shares the source line SL with the write selector in parallel. The gate or control terminal of the read selector $T_R$ is coupled to a word line WL. The word line WL of the write selector and the word line WL of the read selector are a common word line.

In one embodiment, the SL and BL are coupled to a sense amplifier (SA) (not shown). For example, BL is coupled to a positive or + terminal of the SA while SL is coupled to a negative or − terminal of the SA. Other configurations of coupling SL and BL to the SA may also be useful. During a READ operation, the voltages of SL and BL are provided to the SA. Since two separate transistors are used for READ and WRITE which are designed for optimal READ and WRITE operations, a higher sense margin can be achieved using a single WL.

Figure 4:
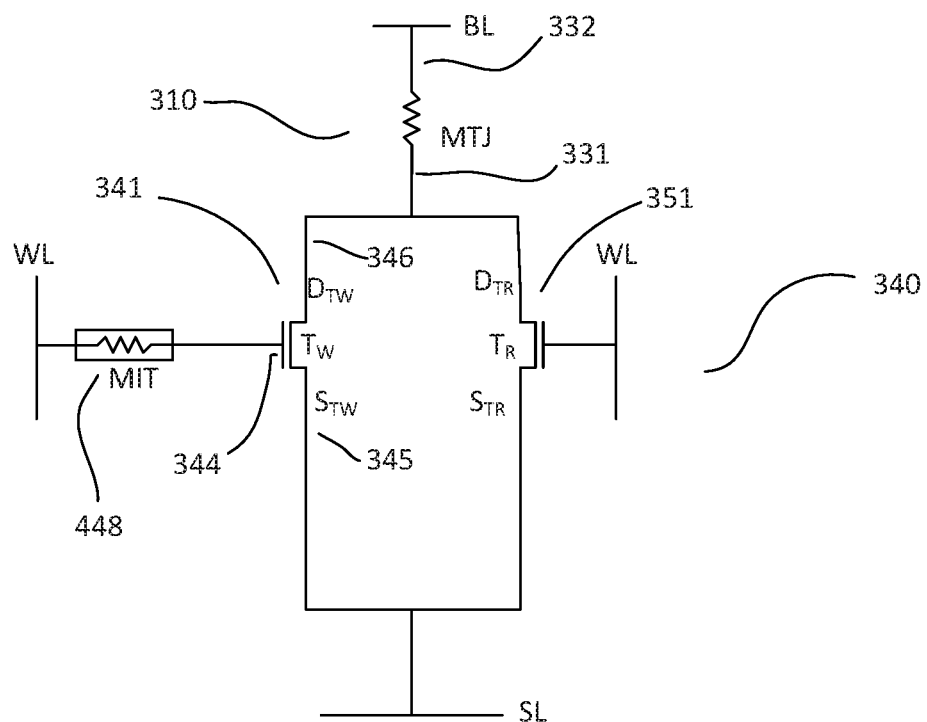
FIG. 4 shows a schematic diagram of another embodiment of a memory cell.

FIG. 4 shows a schematic diagram of another embodiment of a memory cell 400. The memory cell 400 is similar to the memory cell 300 described in FIG. 3. Common elements and features having the same reference numerals may not be described or described in detail. In the interest of brevity, the description of the memory cell 400 below primarily focuses on the difference(s) compared with the memory cell 300 shown in FIG. 3.

Similar to memory cell 300, memory cell 400 also includes a voltage control switch 448. The voltage control switch is a phase transition switch that includes MIT material such as those described in FIG. 3. For example, the MIT material includes chromium or titanium-doped vanadium dioxide ($VO_2$). The MIT material is chosen such that it goes to metallic or conducting state for WRITE (high voltage) operation and will be in insulating state for READ (low voltage) operation. Other suitable types of MIT material, such as but not limited to undoped $VO_2$, may also be useful.

In one embodiment, the memory cell 400 is a STT-MRAM cell with selective WRITE and READ transistors coupled to a single word line WL and configured with a MIT material at the gate terminal of the write selector as shown in FIG. 4. In one embodiment, the voltage control switch is electrically connected in series between WL and the gate of the write selector $T_W$. The MIT material coupled in series with the gate of the write transistor $T_W$, in one embodiment, can be pre-selected such that the write selector $T_W$ will be turned ON only during WRITE (high voltage) operation and turned OFF during READ (low voltage) operation. For example, when the word line voltage is zero, both write and read selectors are OFF. When the word line voltage is low, the pre-selected MIT material is in insulating state, resulting in the write selector being turned OFF while the word line conducts appropriate current to the read selector such that the read selector is turned ON. When the word line voltage is high, the pre-selected MIT material transforms to metallic state becoming conductive and the write selector conducts electrical current. The write selector is turned ON and the read selector remains ON. Thus, the write selector is ON during WRITE (high voltage) operation and OFF during READ (low voltage) operation. Such configuration allows the write selector to be tuned for high current for WRITE operation while the read selector is tuned for READ operation with low voltage when the write selector is OFF.

Continuing with FIG. 4, the first selector element (write transistor) $T_W$ is coupled to the first terminal 331 of the storage element (MTJ) and the voltage control switch. For example, the first terminal 331 of the storage element (MTJ) is coupled to the second terminal (drain terminal) $D_{TW}$ of the write selector $T_W$. The voltage control switch 448 having the MIT material is coupled in series between the gate terminal of $T_W$ and the word line WL. The first terminal (source terminal) $S_{TW}$ of write selector is coupled to the source line SL.

In one embodiment, the second selector element (read selector) $T_R$ is also coupled to the first terminal 331 of the storage element (MTJ). For example, the second (drain terminal) $D_{TR}$ is coupled to the first terminal 331 of the storage element. The first terminal (source terminal) $S_{TR}$ of read selector is coupled to a source line SL. The read selector and the write selector are electrically coupled in parallel between the source line SL and the bit line BL. The gate terminal of the read selector $T_R$ is coupled to a word line WL. The word line WL of the write selector and the word line WL of the read selector are a common word line.

Table 1 below shows exemplary signals or bias conditions applied to the memory cell 300 or 400 for read and write operations based on a 40 nm technology node and $V_{DD}$ of 1.1V.

TABLE 1

| | | signal (V) | | | | |
|---|---|---|---|---|---|---|
| operation | WL | Resistance Of MIT material | BL | SL | NMOS-W | NMOS-R |
| Write "0" | 2 V | Low→conducting | 1.1 V | 0 V | ON | ON |
| Write "1" | 2 V | Low→conducting | 0 V | 1.1 V | ON | ON |
| Read "1" or "0" | 1 V | High→insulating | 0.5 V | 0 V | OFF | ON |

The voltage value for logic high is 1.1 V and a logic low is 0 V. The voltage values are exemplary and may change depending on, for example, the technology node. In addition, the voltage and logic values as presented are for a memory cell with n-type MOS transistors (NMOS-W for write transistor and NMOS-R for read transistor). The values may change for other types of selector transistors.

Figure 5:
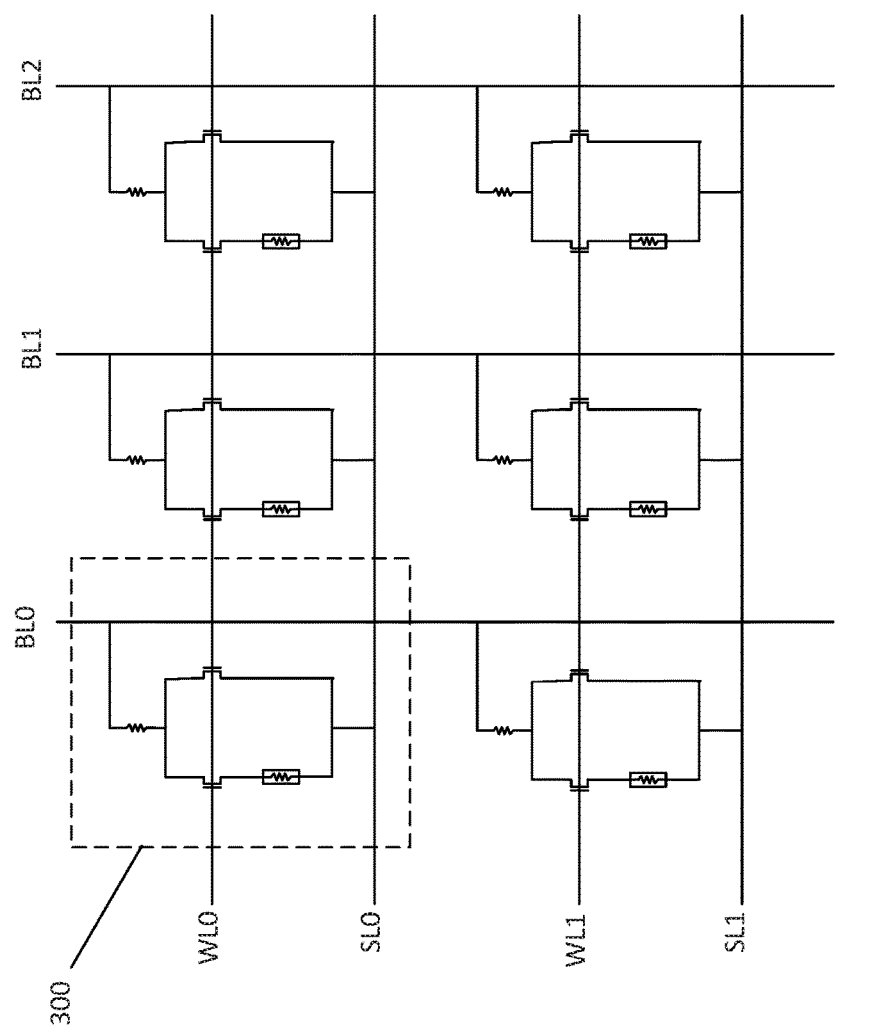
FIG. 5 shows a schematic diagram of an embodiment of a portion of a memory array.

FIG. 5 shows a schematic diagram of an embodiment of a memory array 500. The array includes a plurality of interconnected memory cells 300. The memory cells may be the same or similar to those described in FIG. 3. For example, the memory cells are MRAM cells, such as STT-MRAM cells. Other types of memory cells may also be useful. Common elements may not be described or described in detail.

As shown, the array includes six memory cells arranged in a 2×3 array. For example, the array is arranged to form two rows and three columns of memory cells. Memory cells of a row are interconnected by WLs and SLs (WL0 and SL0 or WL1 and SL1) while memory cells of a column are interconnected by BLs (BL0, BL1 or BL2). The voltage control switch which includes the MIT material is connected in series with the source line SL and the first S/D region (source region) of the first selector element (write selector) in each memory cell. One word line is electrically connected through the gates between the write selector and the read selector of each memory cell and among each row of memory cells. The WLs, SLs, and BLs may be disposed in metal levels of pre-metal dielectric (PMD) level, interlevel dielectric (ILD) levels, storage dielectric levels, or cell dielectric levels as will be described later.

Figure 6:
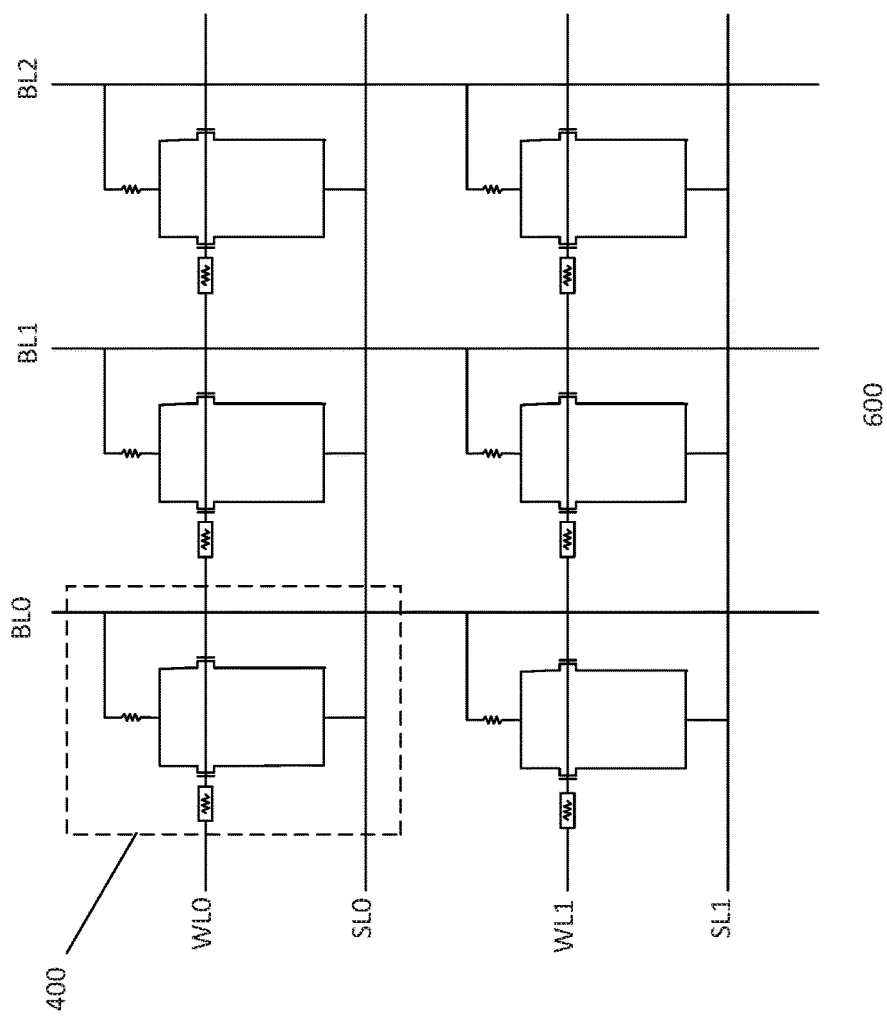
FIG. 6 shows a schematic diagram of another embodiment of a portion of a memory array.

FIG. 6 shows a schematic diagram of another embodiment of a memory array 600. The array includes a plurality of interconnected memory cells 400. The memory cells may be the same or similar to those described in FIG. 4. For example, the memory cells are MRAM cells, such as STT-MRAM cells. Other types of memory cells may also be useful. Common elements may not be described or described in detail.

As shown in FIG. 6, the array includes six memory cells arranged in a 2×3 array. For example, the array is arranged to form two rows and three columns of memory cells. Memory cells of a row are interconnected by WLs and SLs (WL0 and SL0 or WL1 and SL) while memory cells of a column are interconnected by BLs (BL0, BL1 or BL2). The voltage control switch having the MIT material is connected in series with the gate region of the first selector element (write selector) in each memory cell. One word line is electrically connected through the voltage control switch by the gate of the write selector and the gate of the read selector of each memory cell and among each row of memory cells. The WLs, SLs, and BLs may be disposed in metal levels of PMD level, ILD levels, storage dielectric levels, or cell dielectric levels as will be described later.

Figure 7A:
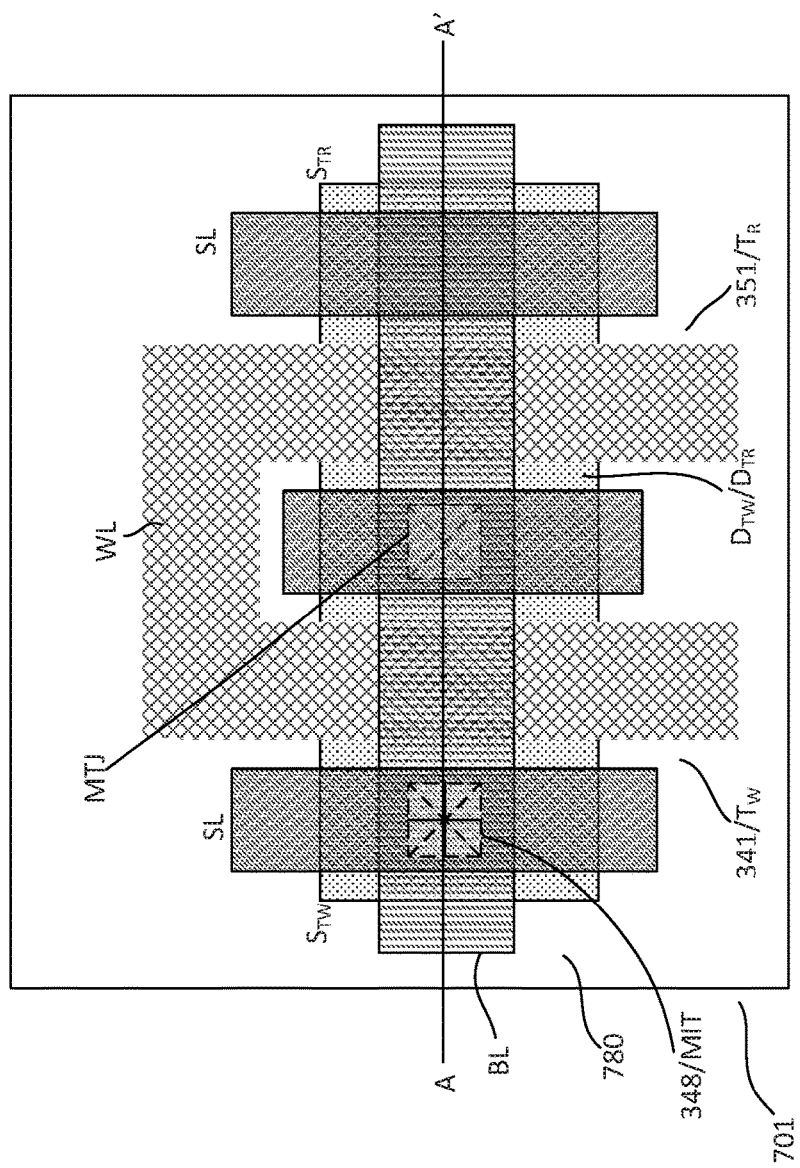
FIGS. 7a-7b show top and cross-sectional views of an embodiment of a memory cell.
Figure 7B:
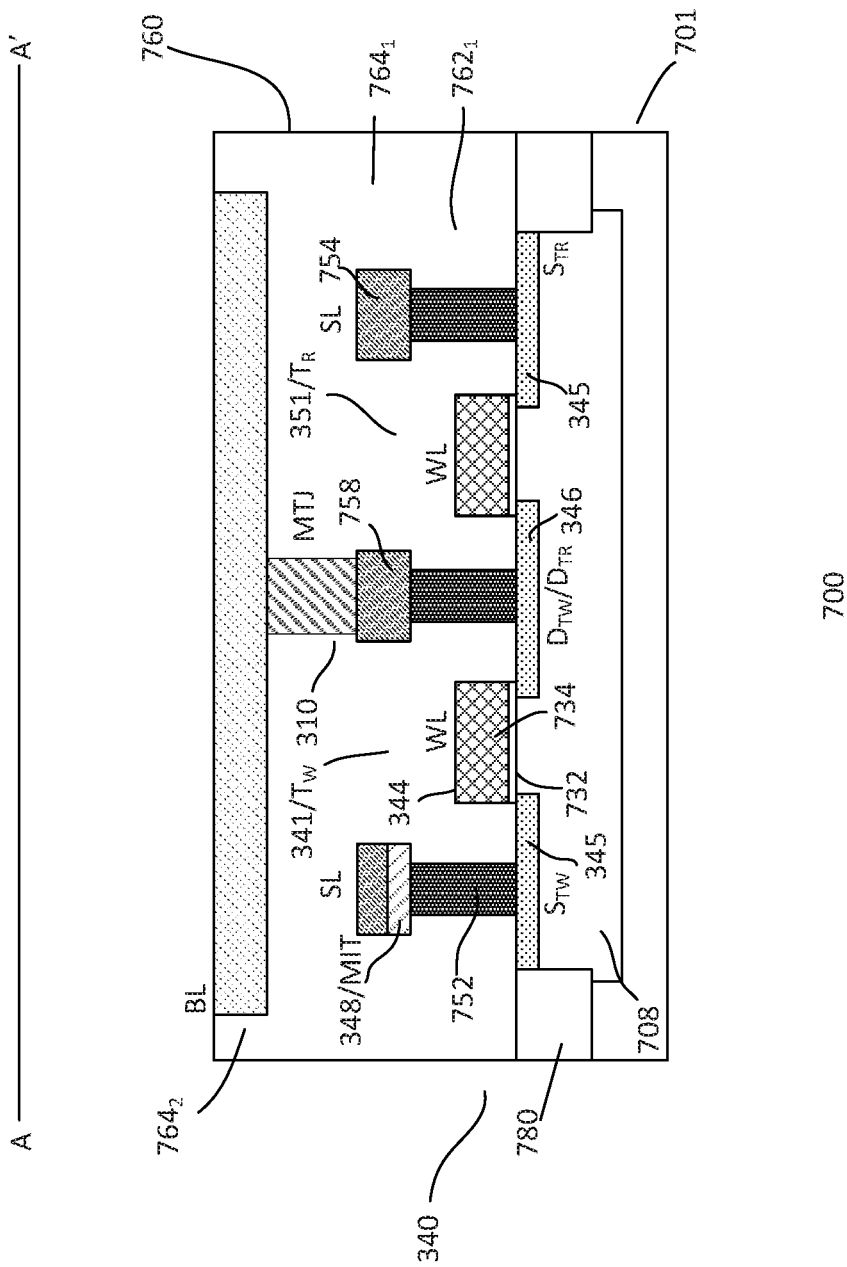

FIG. 7a shows a top view of an embodiment of a device 700 and FIG. 7b shows a cross-sectional view of the device taken along A-A'. The device 700, as shown, includes a memory cell, for example, a NVM cell. The memory cell, for example, is similar to that described in FIG. 3. Common elements may not be described or described in detail.

The memory cell is disposed on a substrate 701. For example, the memory cell is disposed in a cell region of the substrate. The cell region may be part of an array region. For example, the array region may include a plurality of cell regions. The substrate may include other types of device regions (not shown) such as logic regions, including high voltage (HV), low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Isolation regions 780, as shown in FIGS. 7a-7b, may be provided. In one embodiment, the isolation regions are shallow trench isolation (STI) regions. Other types of isolation regions may also be useful. The isolation regions are provided to isolate device regions from other regions. In one embodiment, isolation regions may be provided to isolate memory cells from each other. Other suitable configurations of isolation regions may also be useful.

A cell selector unit of the memory cell is provided in the cell region. The cell selector unit includes first and second selectors 341 and 351. The first selector 341, for example, may be a write selector $T_W$ and the second selector 351 may be a read selector $T_R$. The selectors, in one embodiment, include transistors. For example, the transistors of the selectors are MOS transistors. In one embodiment, the MOS transistors are n-type MOS transistors. Other types of cell selectors may also be useful.

The cell region includes a device well 708, as shown in FIG. 7b, which serves as a body well of the transistors of the selector elements. For example, the cell region includes a common body well for transistors of the write and read selectors. The device well may be a continuous well for the entire memory array. The well 708 may be doped with second polarity type dopants for first polarity type selector transistors. The well, in one embodiment, is a p-type doped well for n-type transistors. The well may be lightly or intermediately doped with second polarity type dopants. For example, the device well may have a dopant concentration of about 1E16 to 1E19/cm$^3$. Other suitable dopant concentrations may also be useful.

As described, the cell selector unit includes first and second selector transistors. A transistor, as shown in FIGS. 7a-7b, includes first and second S/D regions 345 and 346 and a gate 344 disposed between the S/D regions on the substrate. The first S/D regions are the source regions $S_{TW}$ and $S_{TR}$ of the first and second selector transistors. The second S/D regions of the first and second selectors are a common drain region $D_{TW}/D_{TR}$. A gate 344, for example, may include a gate electrode 734 over a gate dielectric 732. The gate electrode may be polysilicon while the gate dielectric may be silicon oxide. Other suitable types of gate electrode and gate dielectric materials may also be useful. A gate, for example, may be a gate conductor along a word line WL direction. The gate conductor forms a common gate for a row of memory cells.

The S/D regions are heavily doped regions with first polarity type dopants. For example, the S/D regions are heavily doped n-type regions for n-type transistors. Providing S/D regions with p-type dopants for p-type transistors may also be useful. The S/D regions may include lightly doped (LD) extension regions (not shown). The LD extension regions may extend slightly under the gate. The gate may include dielectric sidewall spacers (not shown). The spacers, for example, facilitate forming the LD extension regions and S/D regions.

The cell region may be configured in a rectangular shape. Other cell region shapes may also be useful. In one embodiment, the first and second selector transistors are aligned adjacent in the x-direction within the cell region. First and second S/D regions $S_{TW}$ and $D_{TW}$ of the write selector $T_W$ are disposed in the first transistor region. A write gate of the write selector traverses the first transistor region and is disposed between $S_{TW}$ and $D_{TW}$. First and second S/D regions $S_{TR}$ and $D_{TR}$ of the read selector $T_R$ are disposed in the second transistor region. A read gate of the read selector traverses the second transistor region and is disposed between $S_{TR}$ and $D_{TR}$. The source regions and drain regions of the selector transistors, for example, are aligned in the x-direction. As shown, the drain $D_{TW}$ of the write selector and the drain $D_{TR}$ of the read selector form a common drain region. In one embodiment, the write and read gates are configured to form a common word line (WL). For example, the write and read gates may be interconnected through a patterned gate layout such as that shown in FIG. 7a. Alternatively, the write and read gates may be connected to a common metal line which serves as a common WL that is disposed in a metal level over the transistors. Other configurations of the transistors of the cell region may also be useful.

Disposed over the transistors is a dielectric layer 760. The dielectric layer serves as a backend dielectric layer. The backend dielectric layer may include one or more interlevel dielectric (ILD) layers. An ILD layer includes a metal level and a contact level. The metal level 764$_1$ includes conductors or metal lines while the contact level 762$_1$ includes via contacts. The conductors and via contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

As discussed, the backend dielectric layer may include a plurality of ILD levels. For example, x number of ILD levels may be provided. A metal level of an ILD level may be referred to as $M_i$, where i is the i$^{th}$ ILD level of x ILD levels. A contact level of an ILD level may be referred to as $V_{i-1}$, where i is the i$^{th}$ ILD level of x ILD levels.

For the first contact level, it may be referred to as a CA or a pre-metal dielectric (PMD) level. The first metal level may be referred to as M1. For the first ILD level, contacts and metal lines may be formed by separate single damascene processes. Contacts in the PMD level may be tungsten contacts while conductors in M1 may be copper or copper alloy. For upper ILD levels, metal lines and contacts may be formed by dual damascene techniques. Dual damascene processes may employ copper or copper alloys for contacts and conductive lines. Other configurations or techniques for forming metal lines and contacts of the ILD levels may also be useful.

Contacts 752 are disposed in the CA level of the backend dielectric layer. The contacts, for example, are in communication with the S/D regions of the selector transistors. Metal lines 754 are disposed in the first metal or M1 level above the CA level. In one embodiment, source line SL is disposed in M1 which commonly couples the source regions $S_{TW}$ and $S_{TR}$ of the selector transistors $T_W$ and $T_R$. The SL, for example, traverses along the y-direction of the cell region. In addition, an interconnect 758 is disposed in M1 to couple the common drain region $D_{TW}/D_{TR}$ of the selector transistors. It is understood that various connections or interconnects may be formed in other metal levels.

In one embodiment, a voltage control switch 348 which is a phase change switch having MIT material is coupled with the first S/D region of the first selector. In one embodiment, the MIT material is coupled with the source region $S_{TW}$ of the write selector $T_W$ as shown in FIGS. 7a-7b. A source line SL which is disposed in a metal level of an ILD level may be interconnected to the MIT material. In one embodiment, the MIT material is disposed in an ILD level above the source region of the write selector and below the SL as shown in FIG. 7b. In another embodiment, the MIT material may be disposed over top surface of the source region. The MIT material may be an island structure or an elongated structure traversing in the y-direction of the cell region. In one embodiment, the MIT material may be chosen such that it is insulating at low voltage and becomes metallic or conductive at high voltage. In such case, the write selector with the MIT material is turned ON and the write selector selectively couples a write channel or path to the storage element during WRITE (high voltage) operation and the write selector is turned OFF during READ (low voltage) operation.

Referring to FIG. 7b, the storage element or MTJ element 310 is disposed in the backend dielectric layer above the interconnects connecting to the various transistors of the memory cells. The MTJ element, for example, may include configurations such as those described in FIGS. 2a-2b. Other suitable configurations for the MTJ element may also be useful. The storage element, for example, may be disposed over the first metal level. Providing the storage element in other metal levels may also be useful. The storage element may be provided in a storage dielectric level. The storage dielectric level may be a contact level of an ILD level. For example, the storage dielectric level may be V1 above M1. Other dielectric levels of the backend dielectric levels may also be useful. Above the storage dielectric layer is a metal level $764_2$ of an ILD level. For example, the metal level is M2. Other metal levels may also be useful. The metal level M2 includes metal lines disposed in a dielectric layer. In one embodiment, a bit line BL is disposed in metal level $764_2$. The BL traverses along the x-direction of the cell region and is coupled to the MTJ element as shown in FIG. 7b.

Although as described, the various lines and storage element are disposed in specified dielectric levels of the backend dielectric layer, other configurations may also be useful. For example, the various lines and the storage element may be disposed in other upper or additional ILD levels.

In one embodiment, as described, the gates of the write selector and the read selector may be configured as a common wordline WL. In another embodiment, the gates of the write and read selectors may be coupled to a common WL disposed in a metal level of an ILD level disposed over the gates.

As described, the MIT material is chosen such that when the voltage is high, the MIT material in the write selector turns metallic and becomes conductive. Thus, during a WRITE operation, a high voltage signal at the WL in conjunction with the MIT material in conductive state turn the write selector ON and selectively connects the write current path to the storage element. In the WRITE operation, the magnetization direction of the free layer of the MTJ is switched to be parallel or antiparallel to the magnetization direction of the pinned layer by the current passing through the WL. To write either logic "1" or logic "0" signal to the MTJ, the BL and SL associated with the MTJ are driven to the required programming voltages, such as those shown in Table 1 above. On the other hand, when the voltage is low, the MIT material in the write selector is in insulating state. Thus, during a READ operation, a low voltage signal at the WL in conjunction with the MIT material in insulating state turn the write selector OFF and decouples the write path from the storage element while the read selector is turned ON. In the READ operation, the read selector selectively couples the read channel to the MTJ element. This causes current that flows through the MTJ element to be sensed by a sense amplifier (SA). The SA determines the data stored (logic "1" or "0" signal) in the MTJ element based on resistance measured between the free layer and reference layer of the MTJ element.

Figure 8A:
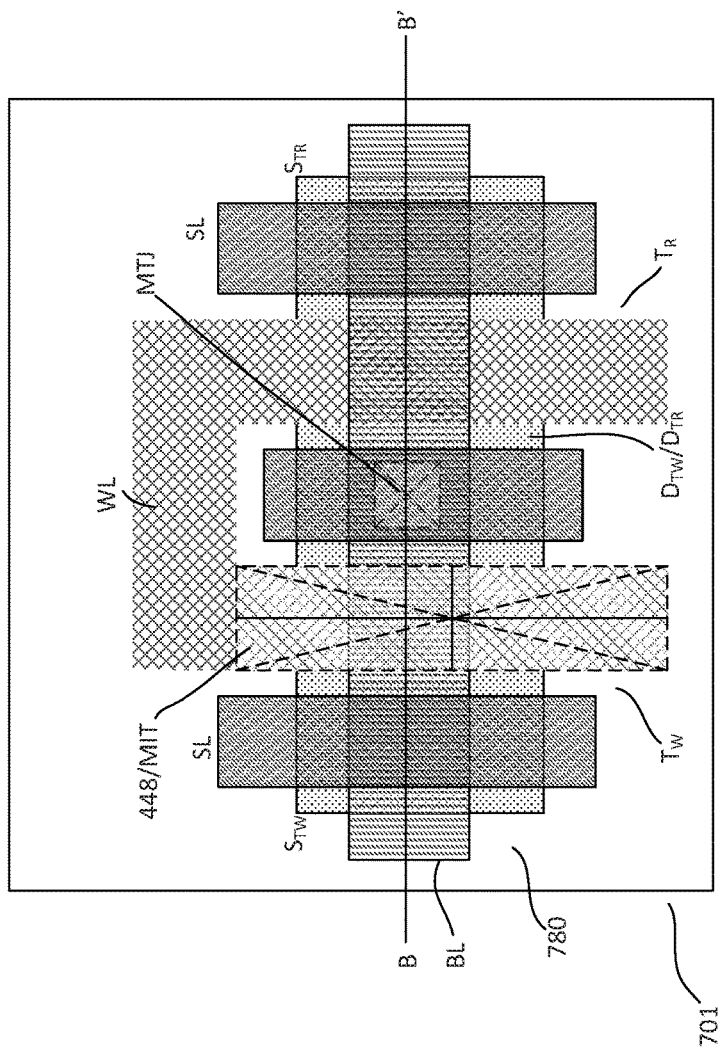
FIGS. 8a-8b show top and cross-sectional views of another embodiment of a memory cell.
Figure 8B:
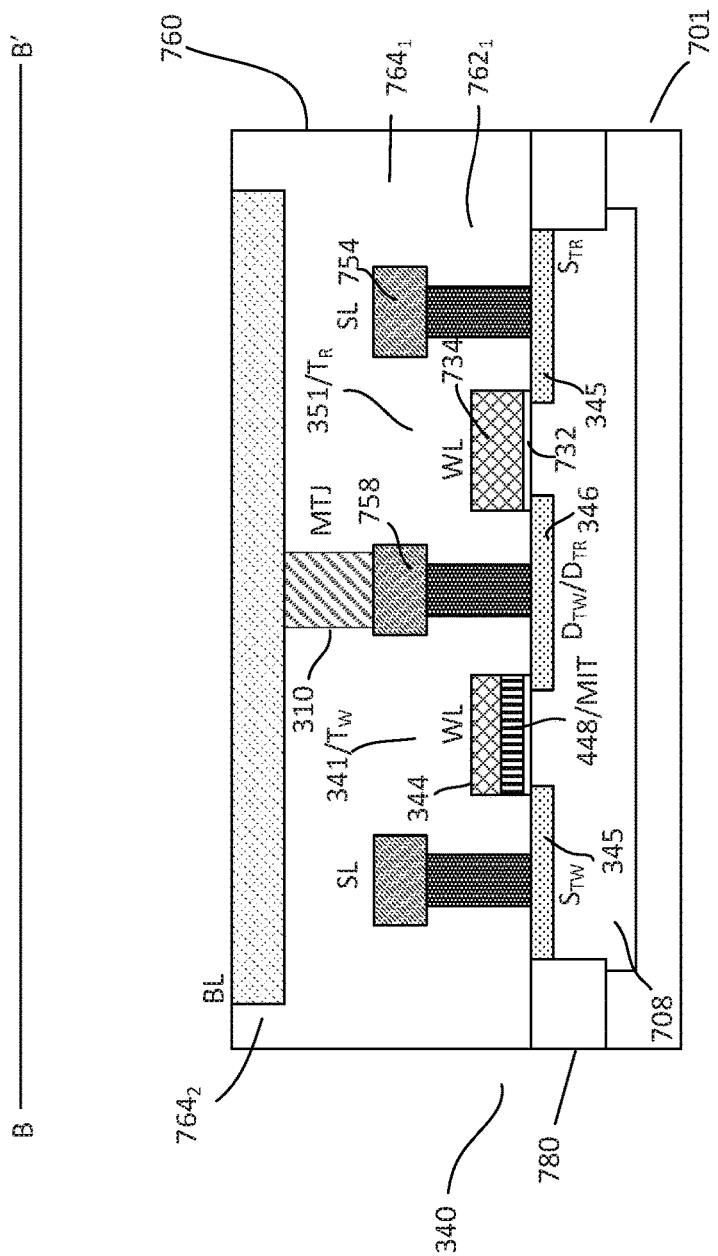

FIG. 8a shows a top view of another embodiment of a device 800 and FIG. 8b shows a cross-sectional view of the device 800 taken along B-B'. The device 800, as shown, is similar to the device 700 described in FIGS. 7a-7b and includes a memory cell similar to the memory cell 400 described in FIG. 4. Common elements having the same reference numerals and operations of the memory cell may not be described or described in detail. In the interest of brevity, the description of the device 800 below primarily focuses on the difference(s) compared with the device 700 shown in FIGS. 7a-7b.

In one embodiment, the device 800 differs from the device 700 in that the voltage control switch 448 which is a phase transition switch having MIT material is disposed in the gate region of the write selector. The MIT material, in one embodiment, is disposed in the gate region above the gate dielectric layer 732 and under the gate electrode 734 of the write selector. In another embodiment, the MIT may also be disposed and electrically connected in series between the WL and the gate of the write selector. The MIT material, for example, may be an island structure or an elongated structure which traverses along the y-direction of the cell region, similar to the gate structure when viewed from top as shown in FIG. 8a.

Similar to the device 700, the gates of the write selector and the read selector of the device 800 may be configured as a common wordline WL. In another embodiment, the gates of the write and read selectors may be coupled to a common WL disposed in a metal level of an ILD level disposed over the gates.

The memory cells 300 and 400 and the devices 700 and 800 result in various advantages. As described, the memory cells and devices employ separate transistors for READ and WRITE operations. This enables separate tuning of the transistors, resulting in high speed and high reliable READ and WRITE operations. Furthermore, the voltage control switch which includes MIT material augments the voltage differences between the SL and BL by turning the write selector ON and OFF. Since this structure uses two separate well-tuned transistors for READ and WRITE operations using a single WL by implementing the MIT material, a higher sense margin can be achieved. In addition, the device as described above includes 2 transistors with 1 MTJ (2T-

1MTJ) configuration. The device may be altered to include 2T-2MTJ or 4T-2MTJ configurations. With such configurations, sensing margin can be doubled, thereby further improving sensing reliability. In addition, the switching of the first and second selector elements is achieved by asymmetric switching. For example, the write selector is turned OFF while the read selector is turned ON when voltage is low; the write selector is turned ON only when voltage is high. Such asymmetric switching reduces power consumption. Moreover, a single WL controls both write selector and read selector. This reduces cell area.

Further, the schemes as described above are flexible. Other suitable phase transition material and configuration may be used as the voltage control switch. For example, the phase transition property of MIT material may be chosen such that the voltage control switch may be implemented in the second source and drain (S/D) region of the write selector. Furthermore, a phase transition material may become insulating in high voltage and conductive in low voltage. Such phase transition characteristics of phase transition material may be coupled with the first or the second S/D region of the read selector. By varying the phase transition material and tuning, the voltage control switch may be implemented at the gate, the first or second S/D region of the first selector; or, the gate, the first or second S/D region of the second selector, or a combination thereof.

FIGS. 9a-9m show cross-sectional views of an embodiment of a process 900 for forming a memory device. The memory device, for example, is the same or similar to that described in FIGS. 7a-7b. Common elements may not be described or described in detail. Although the cross-sectional views show one memory cell, it is understood that the device may include a plurality of memory cells of, for example, a memory array. In one embodiment, the process of forming the STT-MRAM cell is highly compatible with CMOS logic process. For example, the STT-MRAM cell can be formed simultaneously with CMOS logic devices (not shown) on the same substrate.

Figure 9A:
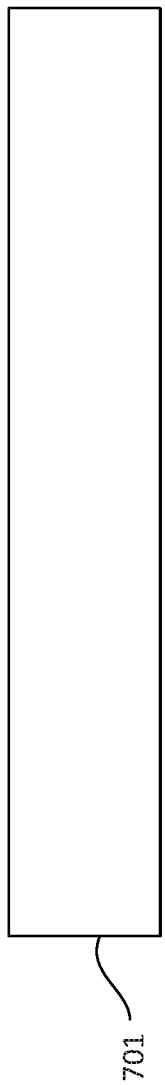

Referring to FIG. 9a, a substrate 701 is provided. The substrate, for example, is a semiconductor substrate, such as silicon substrate. For example, the substrate may be a lightly doped P-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk layer by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

In FIG. 9b, the substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 780 are formed in the substrate. In one embodiment, the isolation regions are shallow trench isolation (STI) regions. Other types of isolation regions may also be useful. The isolation regions are provided to isolate device regions from other regions. The isolation regions may also isolate transistors within a cell region. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

Referring to FIG. 9c, a device well or doped well 708 is formed. The well, for example, serve as a body well of selector transistors of the memory cell. In one embodiment, second polarity type dopants are implanted into the substrate to form the doped well. In one embodiment, an implant mask may be employed to implant the dopants to form the doped well. The implant mask, for example, is a patterned photoresist layer. The implant mask exposes regions of the substrate in which second polarity wells are formed. The well may be lightly or intermediately doped with second polarity type dopants. For example, the well may have a dopant concentration of about 1E16 to 1E19/cm$^3$. Other dopant concentrations may also be useful.

As shown in FIG. 9d, gate layers are formed on the substrate. In one embodiment, the gate layers include a gate dielectric layer 732 and a gate electrode layer 734 formed thereover. The gate dielectric layer, for example, may be a silicon oxide layer formed by, thermal oxidation. As for the gate electrode layer, it may be a polysilicon layer formed by chemical vapor deposition (CVD). Other suitable types of gate layers or techniques for forming gate layers may also be useful.

Referring to FIG. 9e, the gate layers are patterned to form gates 344 of the selector transistors. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating may be used below the photoresist layer. The patterned mask layer is used to pattern the gate layers. For example, an anisotropic etch, such as RIE, is used to remove exposed portions of the gate layers. Other types of etch processes may also be useful. The etch transfers the pattern of the mask layer to the underlying gate layers. Patterning the gate layers forms gates of the selector transistors. The gates, for example, may be gate conductors which traverse along y-direction of the cell region when viewed from top. A gate conductor forms a common gate for a row of memory cells. In one embodiment, the gate layers may be patterned such that it forms a common WL with the patterned gate layout shown in FIG. 7a.

Figure 9F:
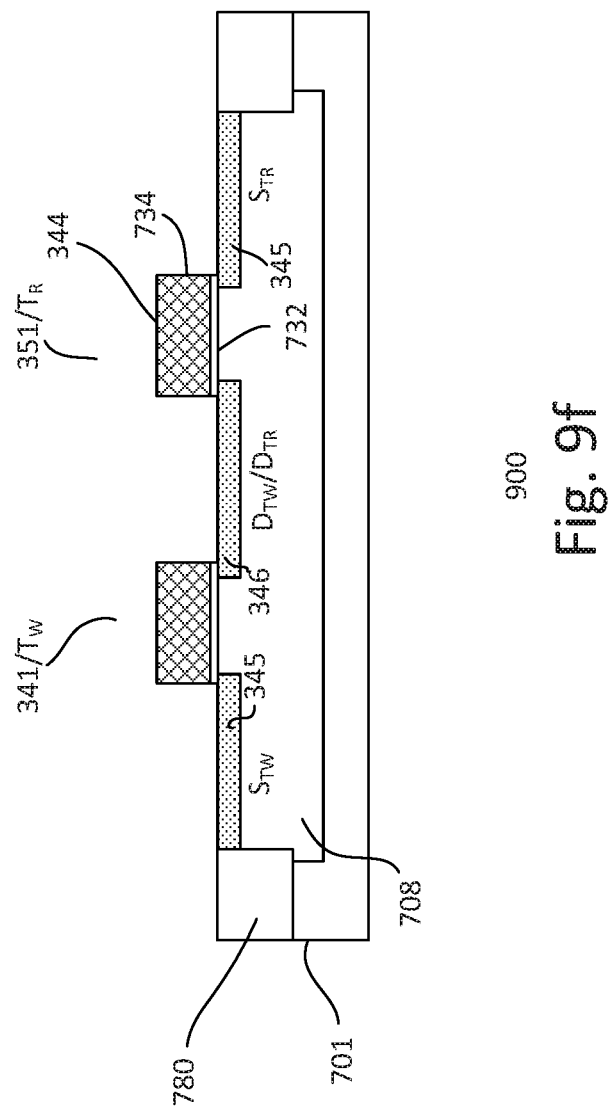

Referring to FIG. 9f, an implant is performed to form first and second S/D regions 345 and 346 after forming the gates. The implant implants first polarity type ions into the substrate adjacent to the gates. In one embodiment, the implant forms heavily doped S/D regions in the substrate adjacent to the gates. For example, first and second S/D regions $S_{TW}$ and $D_{TW}$ are formed for the write selector $T_W$ while first and second S/D regions $S_{TR}$ and $D_{TR}$ are formed for the read selector $T_R$. The second S/D regions (drain regions) of the write and read selectors are a common drain region $D_{TW}/D_{TR}$. Lightly doped (LD) extension regions may be formed as part of the process to form S/D regions. The LD extension regions are formed prior to forming the heavily doped S/D regions. For example, a LD implant is performed to form LD extension regions, followed by forming dielectric spacers on gate sidewalls. The implant to form the S/D regions is performed after sidewall spacers formation.

A dielectric etch stop liner (not shown) may be formed over the transistors. The etch stop liner, for example, is a nitride etch stop liner. Other types of dielectric etch stop liners may also be useful. The etch stop liner serves as an etch stop for subsequent processes, such as contacts formation.

Figure 9G:
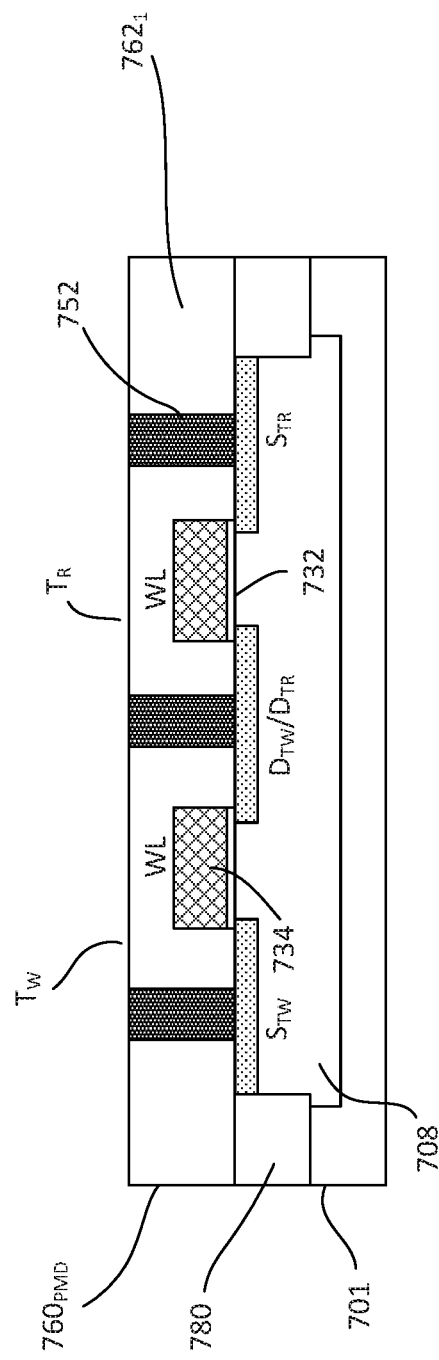

Referring to FIG. 9g, a dielectric layer $760_{PMD}$ is formed on the substrate, covering the transistors. The dielectric layer serves as a premetal dielectric layer (PMD) or first contact layer of the BEOL process. The dielectric layer may be referred to as CA level of the BEOL process. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

In one embodiment, contacts 752 are formed in the dielectric layer. The contacts, for example, connect to contact regions, such as S/D regions and gates of the transistors. Forming the contacts may include forming vias in the dielectric layer to expose the contact regions. As shown in FIG. 9g, the contacts 752 are coupled to $S_{TW}$, $D_{TW}/D_{TR}$ and $S_{TR}$. Forming the vias may be achieved using mask and etch techniques, as previously described. Although not shown, contacts for other S/D regions and gates are also formed. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

Figure 9H:
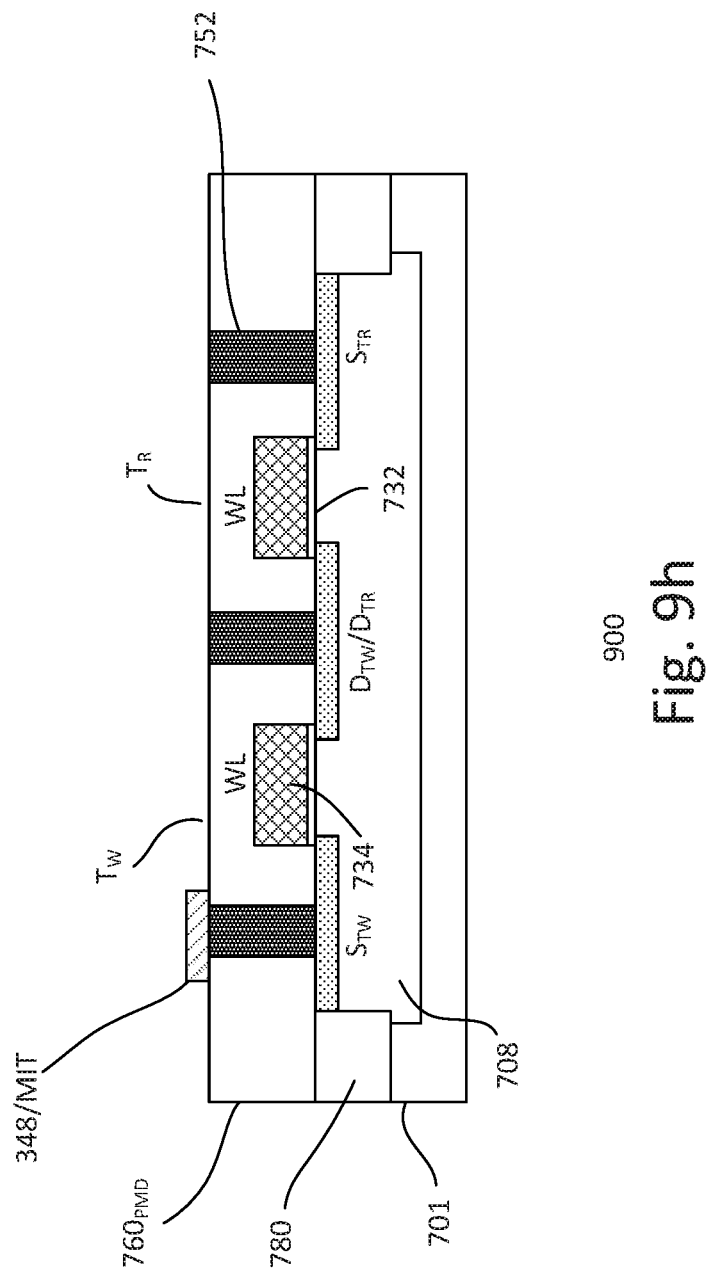

Referring to FIG. 9h, the process continues to form a voltage control switch 348. The voltage control switch, in one embodiment, includes a MIT material. In one embodiment, the MIT material may be formed over the dielectric layer $760_{PMD}$ and above the source region of the write selector. In another embodiment, the MIT material may be formed over top surface of the source region of the write selector. In such case, the MIT material is formed prior to forming the dielectric layer $760_{PMD}$. By way of an example, the MIT material which includes phase transition material, such as $VO_2$, may be deposited and patterned using mask and etch techniques such that the MIT material is formed on the dielectric layer and above the source region of write selector or on the top surface of the source region. The phase transition material, such as $VO_2$, may be formed by any suitable techniques including sputtering, pulsed laser deposition, etc.

The phase transition or MIT material of the voltage control switch may be exploited for their different phase transition properties. For example, the phase transition or MIT materials of the voltage control switch may be exploited by changing the voltage or the direction of the current at the terminals. The electric field-induced metallic phase, reflected in the source-drain current $I_{SD}$, is generally stable over extended periods of time. But the insulating phase could be nearly recovered by applying reverse gate voltages similar in value to those needed to induce the metallic phase. The electric fields and/or temperature vary as a function of the voltage applied to the various transistor terminals. Thus, terminal voltages may be used to exploit the phase transition material and fine tune the voltage control switch.

The phase transition or MIT material can be pre-selected to ensure insulation when a voltage difference between the drain region and source region of the write selector is above a threshold difference and the write selector is OFF while the read selector is ON. The phase transition material can also be pre-selected to ensure conductivity when a voltage difference between the drain region and source region of the write selector is above a threshold difference and the write selector is ON. For example, some phase transition materials such as titanium or chromium-doped vanadium dioxide ($VO_2$) may exhibit a significant increase in resistance and change from being conductive to insulating when a critical electric field is present or a temperature is reached. Other phase transition materials such as undoped vanadium dioxide ($VO_2$) may exhibit a decrease in resistance and change from being insulating to conductive when a critical electric field is present or a temperature is reached.

Figure 9I:
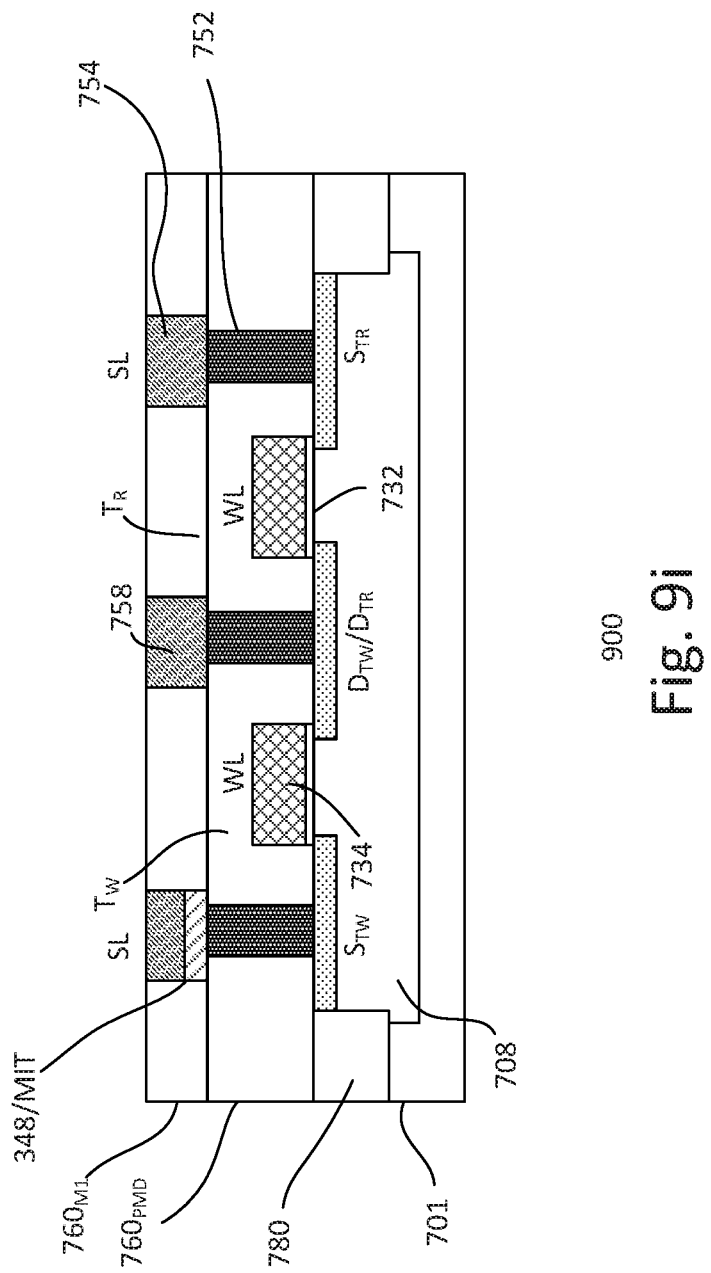

In FIG. 9i, a dielectric layer $760_{M1}$ is formed over the substrate, covering the lower dielectric layer $760_{PMD}$. The dielectric layer, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Conductive or metal lines 754 are formed in the upper dielectric layer of $760_{M1}$ and are shown in FIG. 9i. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, SL is formed to couple MIT material and $S_{TW}$ in the write selector and is formed to also couple with $S_{TR}$ in the read selector. Other interconnects 758 are formed for commonly coupling $D_{TW}$ and $D_{TR}$ of the write and read selectors.

Figure 9J:
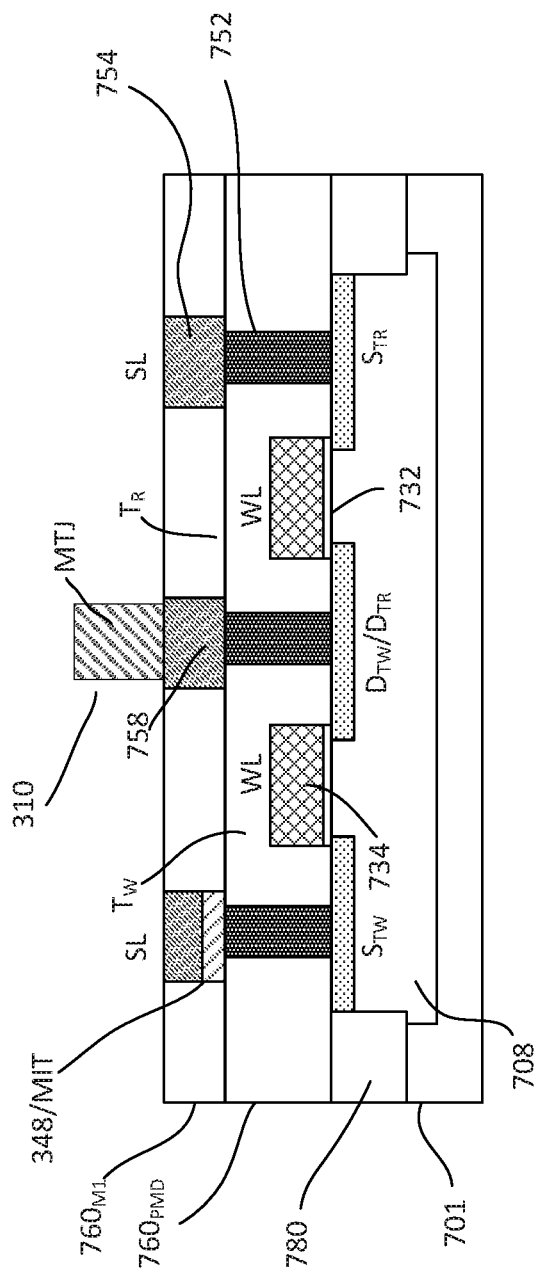

Continuing in FIG. 9j, the process forms a storage element 310 of the memory cell. In one embodiment, the process forms a MTJ element of the memory cell. For example, various layers of storage elements are formed on the dielectric layer $760_{M1}$ and patterned to form the MTJ element shared by the write and read selectors of the memory cell. The MTJ layers may be formed by various deposition techniques. The deposition techniques may depend on the type of layer. The layers may be patterned to form the storage element. Patterning the layers may be achieved using an anisotropic etch, such as RIE, with a patterned mask layer. Other techniques for forming the storage elements may also be useful.

Figure 9K:
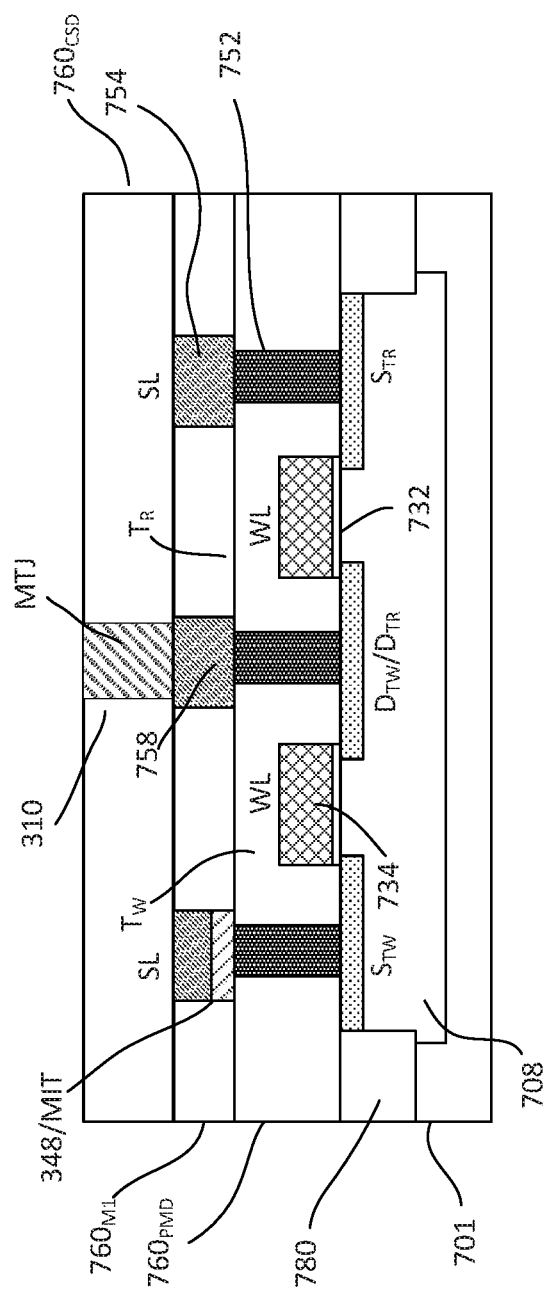
Figure 9I:
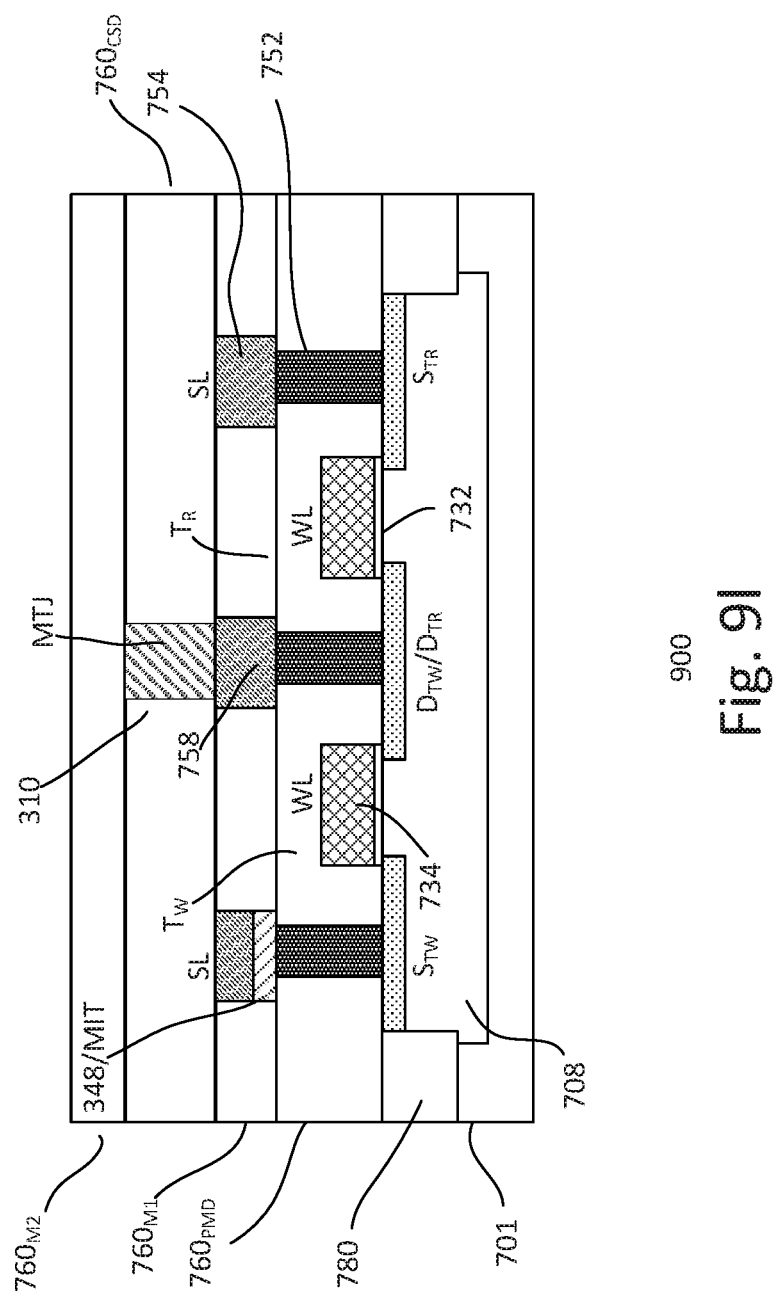

Referring to FIG. 9k, a storage dielectric layer $760_{CSD}$ is formed over the storage or MTJ element. The storage dielectric layer covers the storage element. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. The planarization process exposes the top of the storage elements and provides a planar surface.

In FIG. 9*l*, a dielectric layer $760_{M2}$ is formed over the substrate, covering the storage dielectric layer. The dielectric layer, for example, serves as a metal level of an ILD layer. In one embodiment, the dielectric layer serves as a metal level of the cell dielectric level. For example, the dielectric layer serves as M2 while the storage dielectric layer serves as V1. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

Figure 9M:
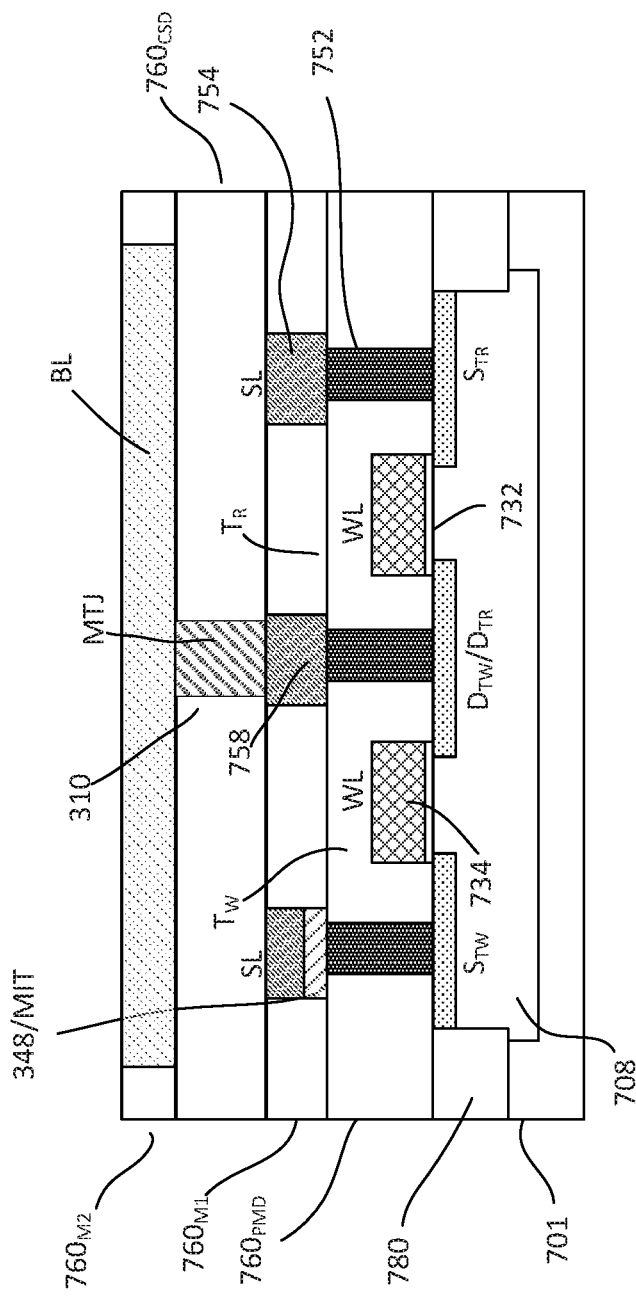

As shown in FIG. 9*m*, conductive or metal lines and contacts (not shown) are formed in the metal level dielectric layer $760_{M2}$ and the storage dielectric layer $760_{CSD}$. The conductive lines and contacts may be formed using, for example, dual damascene techniques. For example, a bit line (BL) may be formed in the metal level dielectric layer $760_{M2}$. This provides a connection for the storage element to BL. For example, the MTJ element is coupled to BL above the common drain region of the write and read selectors.

Although as described, the various lines and storage element are disposed in specified dielectric levels of the backend dielectric layer, other configurations may also be useful. For example, the various lines and the storage element may be formed in other upper or additional ILD levels.

Additional processes may be performed to complete forming the device. For example, the processes may include forming additional ILD levels, pad level, passivation level, pad opening, dicing, assembly and testing. Other types of processes may also be performed.

FIGS. 10*a*-10*e* show cross-sectional views of another embodiment of a process 1000 for forming a device. The device, for example, is the same or similar to that described in FIGS. 8*a*-8*b* and the process 1000 is similar to the process as described in FIGS. 9*a*-9*m*. Common elements may not be described or described in detail. In the interest of brevity, the description of the process 1000 below primarily focuses on the difference(s) compared with the process 900.

Figure 10A:
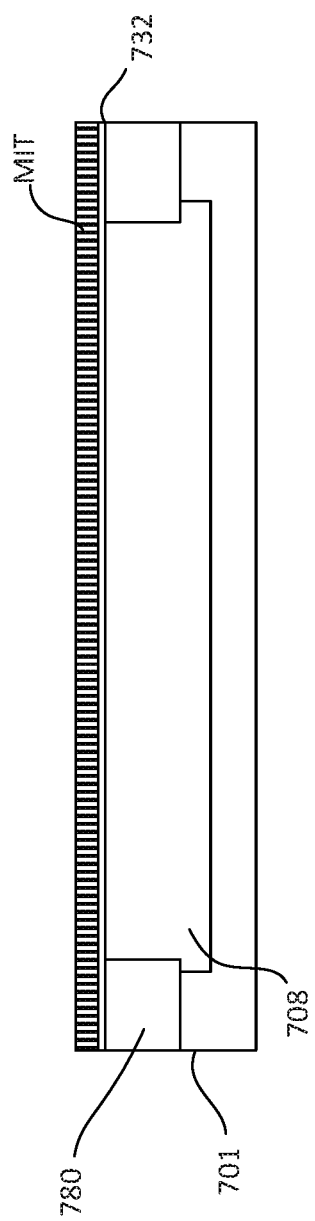
FIGS. 10a-10e show cross-sectional views of another embodiment of a process for forming a memory cell.

In FIG. 10*a*, a substrate 701 is provided. The substrate 110, as shown in FIG. 10*a*, is processed up to the stage where gate dielectric layer 732 is formed over the substrate, similar to that shown in FIG. 9*d*. In one embodiment, the process shown in FIG. 10*a* differs in that a MIT layer is formed over top surface of the gate dielectric 732. Materials and techniques for forming the MIT material is the same or similar to that described in FIG. 9*h*.

Figure 10B:
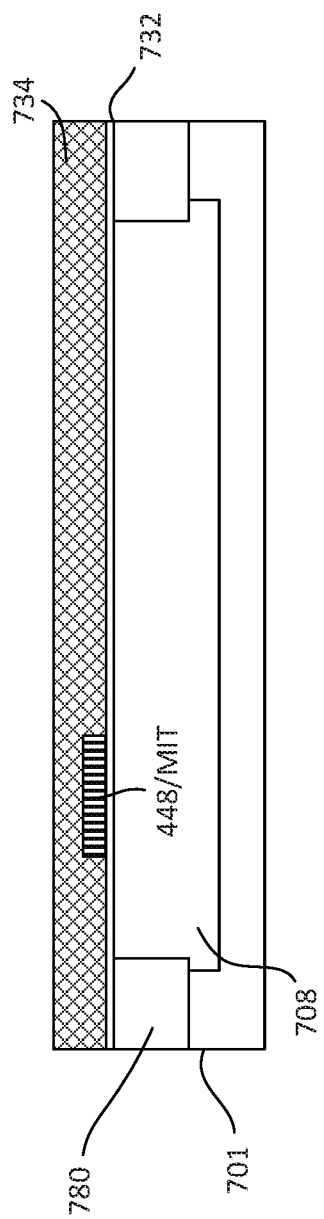

A soft mask (not shown), such as photoresist may be formed over the MIT layer. An exposure source may selectively expose the photoresist layer through a reticle containing the desired pattern. After selectively exposing the photoresist layer, it is developed to form openings corresponding to location where the MIT layer is to be removed. To improve lithographic resolution, an anti-reflective coating may be used below the photoresist layer. The patterned mask layer is used to pattern the MIT layer. For example, an anisotropic etch, such as RIE, is used to remove exposed portions of the MIT layer. Other types of etch processes may also be useful. The etch defines the MIT material of the voltage control switch 448. Referring to FIG. 10*b*, the patterned MIT material, in one embodiment, is defined as an elongated structure traversing along the y-direction of the cell region when viewed from top.

The process continues to blanket deposit a gate electrode layer 734 over and covers the gate dielectric layer 732 and the MIT material. Materials of the gate dielectric and gate electrode layer are the same as that described in FIG. 9*d*.

Figure 10C:
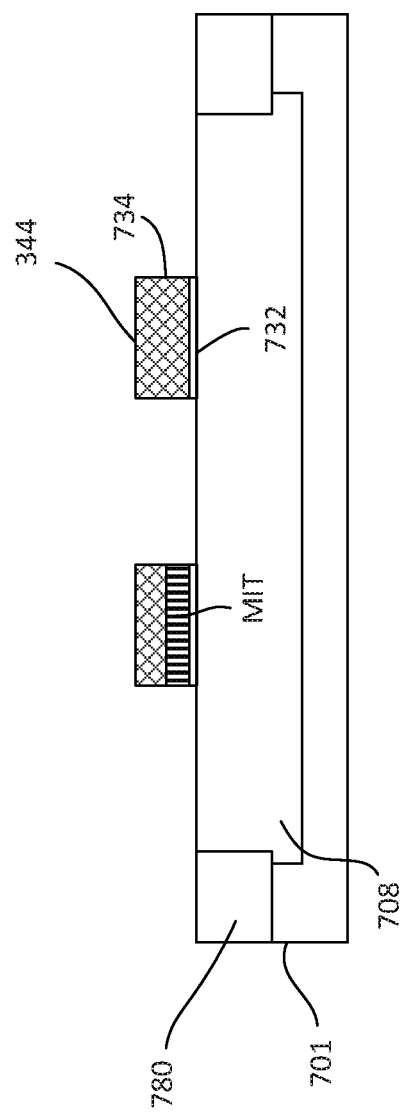

Referring to FIG. 10*c*, the gate layers are patterned to form gates of the write and read selector transistors. Patterning the gate layers may be achieved using mask and etch techniques which are similar or the same as that described in FIG. 9*e*. The gates, for example, may be gate conductors which traverse along the y-direction of the cell region. As shown, the gate electrode of the write selector is disposed over the MIT material while the gate electrode of the read selector is disposed over the gate dielectric.

Figure 10D:
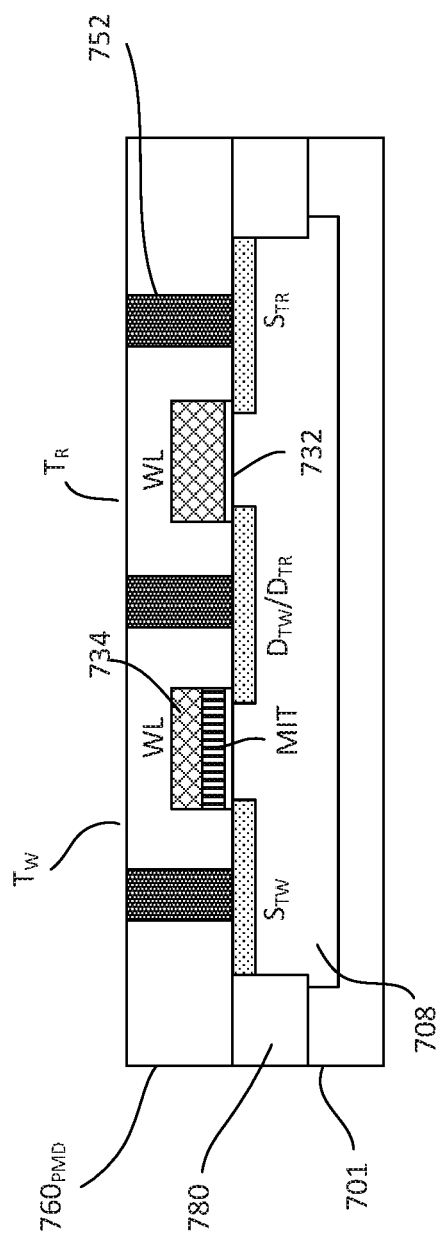

Referring to FIG. 10*d*, the process continues to form first and second S/D regions $S_{TW}$, $S_{TR}$, and $D_{TW}/D_{TR}$ of the write and read selector transistors $T_W$ and $T_R$. A dielectric layer $760_{PMD}$ is formed on the substrate covering the transistors and contacts 752 are formed in the dielectric layer $760_{PMD}$. Materials and techniques for forming the S/D regions, dielectric layer $760_{PMD}$ and contacts 752 are the same as that described in FIGS. 9*f*-9*g*.

Figure 10E:
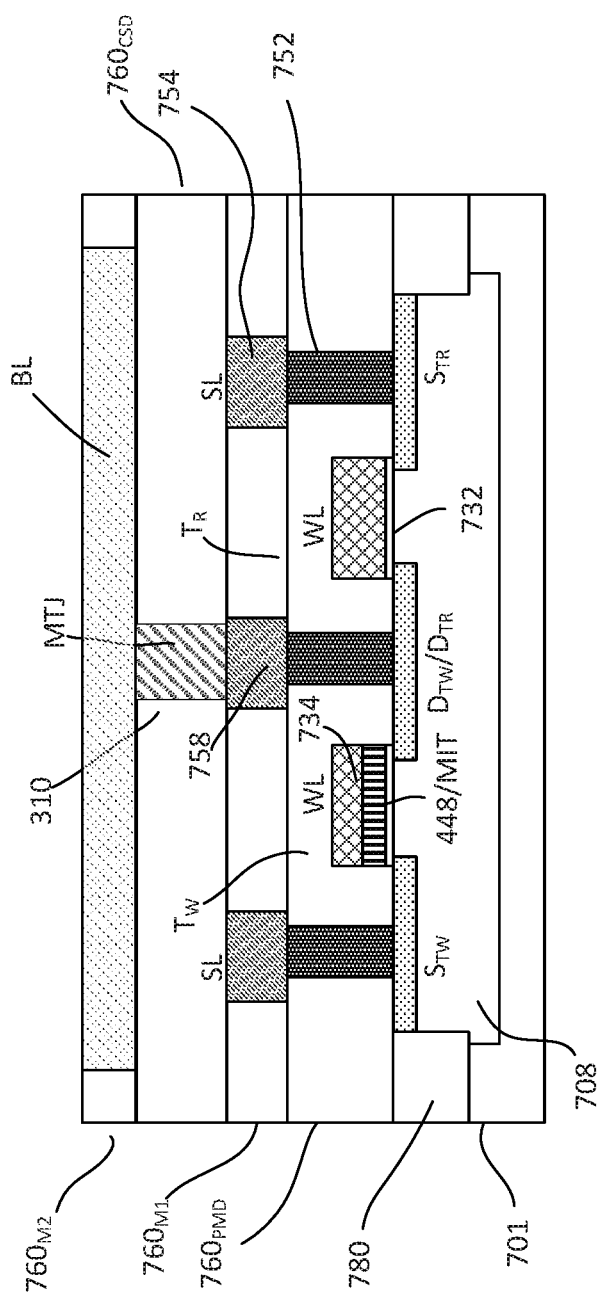

The process 1000 continues by performing the processes as illustrated in FIGS. 9*i*-9*m* until a device shown in FIG. 10*e* is formed. For example, the process continues to form the dielectric layer $760_{M1}$, the SL, the storage or MTJ element, the storage dielectric layer $760_{CSD}$, the dielectric layer $760_{M2}$ and the BL. Materials and techniques for forming the various layers and MTJ elements are the same as that described in FIGS. 9*i*-9*m*, except that no MIT material is formed below the SL. Thus, these materials and techniques will not be described or described in detail.

Additional processes may be performed to complete forming the device. For example, the processes may include forming additional ILD levels, pad level, passivation level, pad opening, dicing, assembly and testing. Other types of processes may also be performed.

In this disclosure, certain words are used interchangeably as known to those skilled in the art. For example, certain singular words apply to plural words and certain plural words apply to singular words. Additionally, the drawings are not necessarily in scale.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
   a first selector having a first gate coupled to a word line (WL) and first selector first and second source/drain (S/D) regions;
   a second selector having a second gate coupled to the WL and second selector first and second S/D regions, wherein the first selector and the second selector second S/D regions are coupled to a source line (SL);
   a storage element which comprises a magnetic tunnel junction (MTJ) element having first and second MTJ terminals, the first MTJ terminal is coupled to the first selector and the second selector first S/D regions and the second MTJ terminal is coupled to a bit line (BL); and a voltage control switch, wherein the voltage control switch,
during a write operation, causes the first selector to be on, and
during a read operation, causes the first selector to be off and the second selector to be on.

2. The memory cell of claim 1 wherein the voltage control switch comprises a phase transition switch such that it is in conductive state when subject to high voltage and in insulating state when subject to low voltage.

3. The memory cell of claim 1 wherein:
the voltage control switch comprises first and second switch terminals, the first switch terminal is coupled to the first selector second S/D region and the second switch terminal is coupled to the SL; and
during the write operation, the second selector is off.

4. The memory cell of claim 3 wherein the voltage control switch comprises a phase transition switch having a metal-insulator-transition (MIT) material.

5. The memory cell of claim 4 wherein the MIT material is disposed in a metal level, wherein the metal level is the same metal level where the SL is disposed and the MIT material is disposed below the SL.

6. The memory cell of claim 1 wherein:
the voltage control switch comprises first and second switch terminals, the first switch terminal is coupled to the first gate and the second switch terminal is coupled to the WL; and
during the write operation, the second selector is on.

7. The memory cell of claim 6 wherein the voltage control switch comprises a phase transition switch having a metal-insulator-transition (MIT) material.

8. The memory cell of claim 7 wherein the first gate of the first selector comprises a first gate electrode and a first gate dielectric, wherein the MIT material is disposed in between the first gate electrode and the first gate dielectric.

9. The memory cell of claim 1 wherein the first and the second selectors are coupled electrically in parallel between the SL and the BL.

10. The memory cell of claim 1 wherein the first selector and the second selector first S/D regions are a common S/D region.

11. The memory cell of claim 1 comprising first and second selector transistors aligned adjacent in an x-direction within a cell region.

12. A memory cell comprising:
a first selector having a first gate coupled to a word line (WL) and first selector first and second source/drain (S/D) regions;
a second selector having a second gate coupled to the WL and second selector first and second S/D regions, wherein the first selector and the second selector second S/D regions are coupled to a source line (SL);
a storage element having first and second storage terminals, the first storage terminal is coupled to the first selector and the second selector first S/D regions and the second storage terminal is coupled to a bit line (BL); and a voltage control switch, wherein the voltage control switch,
during a write operation, causes the first selector to be on, and
during a read operation, causes the first selector to be off and the second selector to be on.

13. The memory cell of claim 12 wherein the storage element comprises a magnetic tunnel junction (MTJ) element.

14. The memory cell of claim 12 wherein the voltage control switch comprises a phase transition switch with a metal insulator transition (MIT) material having a phase transition characteristic such that it is in conductive state when subject to high voltage and in insulating state when subject to low voltage.

15. The memory cell of claim 12 wherein:
the voltage control switch comprises first and second switch terminals, the first switch terminal is coupled to the first selector second S/D region and the second switch terminal is coupled to the SL; and
during the write operation, the second selector is off.

16. The memory cell of claim 15 wherein the voltage control switch comprises a phase transition switch having a metal-insulator-transition (MIT) material, wherein the MIT material is disposed in a metal level, wherein the metal level is the same metal level where the SL is disposed and the MIT material is disposed below the SL.

17. The memory cell of claim 16 wherein:
the voltage control switch comprises first and second switch terminals, the first switch terminal is coupled to the first gate and the second switch terminal is coupled to the WL; and
during the write operation, the second selector is on.

18. The memory cell of claim 17 wherein the voltage control switch comprises a phase transition switch having a metal-insulator-transition (MIT) material, the voltage control switch is disposed between a first gate electrode and a first gate dielectric of the first gate.

19. The memory cell of claim 12 wherein the first selector and the second selector first S/D regions are a common S/D region.

20. A memory cell comprising:
a first selector having a first gate coupled to a word line (WL) and first and second source/drain (S/D) regions;
a second selector having a second gate coupled to the WL and first and second S/D regions, wherein the second S/D regions of the first and the second selectors are a common S/D region, the common S/D region of the first and second selectors is coupled to a source line (SL);
a storage element which comprises a magnetic tunnel junction (MTJ) element is coupled with a bit line (BL) and the first and the second selectors; and
a voltage control switch which comprises a metal-insulator-transition (MIT) material coupled to the first selector, wherein the voltage control switch is a phase transition switch, wherein the MIT material comprises a phase transition characteristic such that it is in conductive state when subject to high voltage and in insulating state when subject to low voltage.

* * * * *